(12) United States Patent
Jaiprakash et al.

(10) Patent No.: US 7,274,078 B2
(45) Date of Patent: *Sep. 25, 2007

(54) DEVICES HAVING VERTICALLY-DISPOSED NANOFABRIC ARTICLES AND METHODS OF MAKING THE SAME

(75) Inventors: Venkatachalam C. Jaiprakash, Fremont, CA (US); Jonathan W. Ward, Fairfax, VA (US); Thomas Rueckes, Rockport, MA (US); Brent M. Segal, Woburn, MA (US)

(73) Assignee: Nantero, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/158,544

(22) Filed: Jun. 22, 2005

(65) Prior Publication Data

US 2007/0018260 A1 Jan. 25, 2007

Related U.S. Application Data

(63) Continuation of application No. 10/776,572, filed on Feb. 11, 2004, now Pat. No. 6,924,538, application No. 11/158,544, which is a continuation-in-part of application No. 10/341,005, filed on Jan. 13, 2003, and a continuation-in-part of application No. 10/128,118, filed on Jan. 13, 2003, now Pat. No. 6,706,402, and a continuation-in-part of application No. 10/033,323, filed on Dec. 28, 2001, now Pat. No. 6,911,682, and a continuation-in-part of application No. 09/915,093, filed on Jul. 25, 2001, now Pat. No. 6,919,592.

(60) Provisional application No. 60/446,786, filed on Feb. 12, 2003, provisional application No. 60/446,783, filed on Feb. 12, 2003.

(51) Int. Cl.
*H01L 27/14* (2006.01)

(52) U.S. Cl. ............... 257/414; 257/415; 257/E21.582; 977/943

(58) Field of Classification Search ................. 257/414, 257/428, 429, 415, E21.582; 977/700, 742, 977/743, 752, 783, 784, 902, 932, 943

See application file for complete search history.

(56) References Cited

U.S. PATENT DOCUMENTS 3,448,302 A 6/1969 Shanefield
(Continued)

FOREIGN PATENT DOCUMENTS

EP 0217023 4/1987
(Continued)

OTHER PUBLICATIONS

Ajayan, P.M., et al., "Nanometre-size tubes of carbon," *Rep. Prog. Phys.*, 1997, vol. 60, pp. 1025-1062.
(Continued)

*Primary Examiner*—Brook Kebede
(74) *Attorney, Agent, or Firm*—Wilmer Cutler Pickering Hale and Dorr LLP

(57) ABSTRACT

Electro-mechanical switches and memory cells using vertically-disposed nanofabric articles and methods of making the same are described. An electro-mechanical device, includes a structure having a major horizontal surface and a channel formed therein. A conductive trace is in the channel; and a nanotube article vertically suspended in the channel, in spaced relation to a vertical wall of the channel. The article is electro-mechanically deflectable in a horizontal direction toward the conductive trace. Under certain embodiments, the vertically suspended extent of the nanotube article is defined by a thin film process. Under certain embodiments, the vertically suspended extent of the nanotube article is about 50 nanometers or less. Under certain embodiments, the nanotube article is clamped with a conducting material disposed in porous spaces between some nanotubes of the nanotube article. Under certain embodiments, the nanotube article is formed from a porous nanofabric. Under certain embodiments, the nanotube article is electromechanically deflectable into contact with the conductive trace and the contact is either a volatile state or non-volatile state depending on the device construction. Under certain embodiments, the vertically oriented device is arranged into various forms of three-trace devices. Under certain embodiments, the channel may be used for multiple independent devices, or for devices that share a common electrode.

21 Claims, 19 Drawing Sheets

U.S. PATENT DOCUMENTS

| | | |
|---|---|---|
| 3,740,494 A | 6/1973 | Dunand et al. |
| 3,892,890 A | 7/1975 | Watanabe et al. |
| 3,970,887 A | 7/1976 | Smith et al. |
| 4,324,814 A | 4/1982 | Reichert |
| 4,378,629 A | 4/1983 | Bozler et al. |
| 4,495,511 A | 1/1985 | Yoder |
| 4,510,016 A | 4/1985 | Chi et al. |
| 4,524,431 A | 6/1985 | Haken et al. |
| 4,673,474 A | 6/1987 | Ogawa |
| 4,694,427 A | 9/1987 | Miyamoto et al. |
| 4,701,842 A | 10/1987 | Olnowich |
| 4,707,197 A | 11/1987 | Hensel et al. |
| 4,758,534 A | 7/1988 | Derkits, Jr. et al. |
| 4,819,212 A | 4/1989 | Nakai et al. |
| 4,845,533 A | 7/1989 | Pryor et al. |
| 4,853,893 A | 8/1989 | Eaton, Jr. et al. |
| 4,876,667 A | 10/1989 | Ross et al. |
| 4,888,630 A | 12/1989 | Paterson |
| 4,901,121 A | 2/1990 | Gibson et al. |
| 4,903,090 A | 2/1990 | Yokoyama |
| 4,939,556 A | 7/1990 | Eguchi et al. |
| 4,947,226 A | 8/1990 | Huang et al. |
| 4,979,149 A | 12/1990 | Popovic et al. |
| 4,985,871 A | 1/1991 | Catlin |
| 5,010,037 A | 4/1991 | Lin et al. |
| 5,031,145 A | 7/1991 | Lever |
| 5,032,538 A | 7/1991 | Bozler et al. |
| 5,051,956 A | 9/1991 | Burns et al. |
| 5,057,883 A | 10/1991 | Noda et al. |
| 5,089,545 A | 2/1992 | Pol |
| 5,155,561 A | 10/1992 | Bozler et al. |
| 5,161,218 A | 11/1992 | Catlin |
| 5,168,070 A | 12/1992 | Luth et al. |
| 5,175,597 A | 12/1992 | Cachier et al. |
| 5,184,320 A | 2/1993 | Dye |
| 5,196,396 A | 3/1993 | Lieber |
| 5,198,390 A | 3/1993 | MacDonald et al. |
| 5,198,994 A | 3/1993 | Natori et al. |
| 5,216,631 A | 6/1993 | Sliwa, Jr. |
| 5,252,835 A | 10/1993 | Lieber et al. |
| 5,271,862 A | 12/1993 | Freese |
| 5,290,715 A | 3/1994 | Pandya |
| 5,316,979 A | 5/1994 | MacDonald et al. |
| 5,346,683 A | 9/1994 | Green et al. |
| 5,412,785 A | 5/1995 | Skruhak et al. |
| 5,424,054 A | 6/1995 | Bethune et al. |
| 5,426,070 A | 6/1995 | Shaw et al. |
| 5,444,421 A | 8/1995 | Carroll et al. |
| 5,444,651 A | 8/1995 | Yamamoto et al. |
| 5,453,970 A | 9/1995 | Rust et al. |
| 5,456,986 A | 10/1995 | Majetich et al. |
| 5,475,341 A | 12/1995 | Reed |
| 5,479,172 A | 12/1995 | Smith et al. |
| 5,482,601 A | 1/1996 | Ohshima et al. |
| 5,517,194 A | 5/1996 | Carroll et al. |
| 5,521,602 A | 5/1996 | Carroll et al. |
| 5,533,061 A | 7/1996 | Smith et al. |
| 5,538,916 A | 7/1996 | Kuroi et al. |
| 5,547,748 A | 8/1996 | Ruoff et al. |
| 5,553,099 A | 9/1996 | Carroll et al. |
| 5,563,424 A | 10/1996 | Yang et al. |
| 5,586,286 A | 12/1996 | Santeler et al. |
| 5,589,692 A | 12/1996 | Reed |
| 5,590,078 A | 12/1996 | Chatter |
| 5,592,642 A | 1/1997 | Thomas |
| 5,592,643 A | 1/1997 | Thomas |
| 5,592,644 A | 1/1997 | Thomas |
| 5,608,246 A | 3/1997 | Yeager et al. |
| 5,608,888 A | 3/1997 | Purcell et al. |
| 5,623,638 A | 4/1997 | Andrade |
| 5,626,670 A | 5/1997 | Varshney et al. |
| 5,626,812 A | 5/1997 | Ebbesen et al. |
| 5,640,133 A | 6/1997 | MacDonald et al. |
| 5,640,343 A | 6/1997 | Gallagher et al. |
| 5,650,958 A | 7/1997 | Gallagher et al. |
| 5,651,126 A | 7/1997 | Bailey et al. |
| 5,652,856 A | 7/1997 | Santeler et al. |
| 5,676,865 A | 10/1997 | Chang |
| 5,699,317 A | 12/1997 | Sartore et al. |
| 5,716,708 A | 2/1998 | Lagow |
| 5,719,073 A | 2/1998 | Shaw et al. |
| 5,721,862 A | 2/1998 | Sartore et al. |
| 5,739,057 A | 4/1998 | Tiwari et al. |
| 5,747,180 A | 5/1998 | Miller et al. |
| 5,751,156 A | 5/1998 | Muller et al. |
| 5,753,088 A | 5/1998 | Olk |
| 5,780,101 A | 7/1998 | Nolan et al. |
| 5,781,717 A | 7/1998 | Wu et al. |
| 5,793,697 A | 8/1998 | Scheuerlein |
| 5,799,209 A | 8/1998 | Chatter |
| 5,802,583 A | 9/1998 | Yeager et al. |
| 5,829,125 A | 11/1998 | Fujimoto et al. |
| 5,838,165 A | 11/1998 | Chatter |
| 5,840,435 A | 11/1998 | Lieber et al. |
| 5,841,692 A | 11/1998 | Gallagher et al. |
| 5,846,849 A | 12/1998 | Shaw et al. |
| 5,847,454 A | 12/1998 | Shaw et al. |
| 5,847,565 A | 12/1998 | Narayanan et al. |
| 5,850,089 A | 12/1998 | Varshney et al. |
| 5,850,231 A | 12/1998 | Orimoto et al. |
| 5,858,862 A | 1/1999 | Westwater et al. |
| 5,875,451 A | 2/1999 | Joseph |
| 5,878,840 A | 3/1999 | Tessum et al. |
| 5,887,272 A | 3/1999 | Sartore et al. |
| 5,897,945 A | 4/1999 | Lieber et al. |
| 5,903,010 A | 5/1999 | Flory et al. |
| 5,909,624 A | 6/1999 | Yeager et al. |
| 5,914,553 A | 6/1999 | Adams et al. |
| 5,925,465 A | 7/1999 | Ebbesen et al. |
| 5,928,450 A | 7/1999 | Russell |
| 5,930,164 A | 7/1999 | Zhu |
| 5,939,785 A | 8/1999 | Klonis et al. |
| 5,946,228 A | 8/1999 | Abraham et al. |
| 5,946,930 A | 9/1999 | Anthony |
| 5,973,444 A * | 10/1999 | Xu et al. .................... 313/309 |
| 5,985,446 A | 11/1999 | Lagow |
| 5,993,697 A | 11/1999 | Cohen et al. |
| 5,994,733 A | 11/1999 | Nishioka et al. |
| 5,997,832 A | 12/1999 | Lieber et al. |
| 6,025,618 A | 2/2000 | Chen |
| 6,031,711 A | 2/2000 | Tennent et al. |
| 6,031,756 A | 2/2000 | Gimzewski et al. |
| 6,036,774 A | 3/2000 | Lieber et al. |
| 6,038,060 A | 3/2000 | Crowley |
| 6,038,637 A | 3/2000 | Berube et al. |
| 6,044,008 A | 3/2000 | Choi et al. |
| 6,048,740 A | 4/2000 | Hsu et al. |
| 6,049,856 A | 4/2000 | Bolyn |
| 6,051,866 A | 4/2000 | Shaw et al. |
| 6,052,263 A | 4/2000 | Gill |
| 6,052,313 A | 4/2000 | Atsumi et al. |
| 6,057,637 A | 5/2000 | Zettl et al. |
| 6,060,724 A | 5/2000 | Flory et al. |
| 6,062,931 A | 5/2000 | Chuang et al. |
| 6,063,243 A | 5/2000 | Zettl et al. |
| 6,064,107 A | 5/2000 | Yeh et al. |
| 6,069,380 A | 5/2000 | Chou et al. |
| 6,072,718 A | 6/2000 | Abraham et al. |
| 6,083,624 A | 7/2000 | Hiura et al. |
| 6,087,293 A | 7/2000 | Carnahan et al. |
| 6,088,760 A | 7/2000 | Walker et al. |
| 6,100,109 A | 8/2000 | Melzner et al. |
| 6,104,633 A | 8/2000 | Abraham et al. |
| 6,105,381 A | 8/2000 | Ghoshal |

| | | | | | |
|---|---|---|---|---|---|
| 6,108,725 A | 8/2000 | Chatter | 6,515,339 B2 | 2/2003 | Shin et al. |
| 6,128,214 A | 10/2000 | Kuekes et al. | 6,518,156 B1 | 2/2003 | Chen et al. |
| 6,136,160 A | 10/2000 | Hrkut et al. | 6,528,020 B1 | 3/2003 | Dai et al. |
| 6,138,219 A | 10/2000 | Soman et al. | 6,533,620 B2 | 3/2003 | Franzen et al. |
| 6,144,481 A | 11/2000 | Kowarz et al. | 6,541,309 B2 | 4/2003 | Chen |
| 6,146,227 A | 11/2000 | Mancevski | 6,548,841 B2 | 4/2003 | Frazier et al. |
| 6,156,256 A | 12/2000 | Kennel | 6,559,468 B1 | 5/2003 | Kuekes et al. |
| 6,159,620 A | 12/2000 | Heath et al. | 6,566,983 B2 | 5/2003 | Shin |
| 6,159,742 A | 12/2000 | Lieber et al. | 6,574,130 B2 | 6/2003 | Segal et al. |
| 6,165,890 A | 12/2000 | Kohl et al. | 6,586,965 B2 | 7/2003 | Kuekes |
| 6,166,948 A | 12/2000 | Parkin et al. | 6,595,405 B2 | 7/2003 | Terunuma et al. |
| 6,177,703 B1 | 1/2001 | Cunningham | 6,611,033 B2 | 8/2003 | Hsu et al. |
| 6,183,714 B1 | 2/2001 | Smalley et al. | 6,630,772 B1 | 10/2003 | Bower et al. |
| 6,187,823 B1 | 2/2001 | Haddon et al. | 6,642,639 B2 * | 11/2003 | Choi et al. .................. 313/309 |
| 6,190,634 B1 | 2/2001 | Lieber et al. | 6,643,165 B2 | 11/2003 | Segal et al. |
| 6,198,655 B1 | 3/2001 | Heath et al. | 6,645,628 B2 | 11/2003 | Shiffler, Jr. et al. |
| 6,203,814 B1 | 3/2001 | Fisher et al. | 6,658,634 B1 | 12/2003 | Goodnow et al. |
| 6,203,864 B1 | 3/2001 | Zhang et al. | 6,673,424 B1 | 1/2004 | Lindsay |
| 6,212,597 B1 | 4/2001 | Conlin et al. | 6,706,402 B2 | 3/2004 | Rueckes et al. |
| 6,219,212 B1 | 4/2001 | Gill et al. | 6,707,098 B2 | 3/2004 | Hofmann et al. |
| 6,221,330 B1 | 4/2001 | Moy et al. | 6,709,566 B2 | 3/2004 | Cumings et al. |
| 6,226,722 B1 | 5/2001 | Shippy et al. | 6,743,408 B2 | 6/2004 | Lieber et al. |
| 6,231,744 B1 | 5/2001 | Ying et al. | 6,750,471 B2 | 6/2004 | Bethune et al. |
| 6,231,980 B1 | 5/2001 | Cohen et al. | 6,759,693 B2 | 7/2004 | Vogeli et al. |
| 6,232,706 B1 | 5/2001 | Dai et al. | 6,774,052 B2 | 8/2004 | Vogeli et al. |
| 6,233,665 B1 | 5/2001 | Bolyn | 6,781,166 B2 | 8/2004 | Lieber et al. |
| 6,237,130 B1 | 5/2001 | Soman et al. | 6,784,028 B2 | 8/2004 | Rueckes et al. |
| 6,239,547 B1 | 5/2001 | Uemura et al. | 6,803,840 B2 | 10/2004 | Jin |
| 6,250,984 B1 | 6/2001 | Jin et al. | 6,808,746 B1 | 10/2004 | Dai et al. |
| 6,256,767 B1 | 7/2001 | Kuekes et al. | 6,809,462 B2 | 10/2004 | Pelrine et al. |
| 6,259,277 B1 | 7/2001 | Tour et al. | 6,809,465 B2 | 10/2004 | Hunt et al. |
| 6,262,469 B1 | 7/2001 | Le et al. | 6,833,558 B2 | 12/2004 | Lee et al. |
| 6,265,333 B1 | 7/2001 | Dzenis et al. | 6,835,591 B2 | 12/2004 | Rueckes et al. |
| 6,277,318 B1 | 8/2001 | Bower et al. | 6,858,197 B1 | 2/2005 | Delzeit |
| 6,300,205 B1 | 10/2001 | Fulford et al. | 6,863,942 B2 | 3/2005 | Ren et al. |
| 6,314,019 B1 | 11/2001 | Kuekes et al. | 6,896,864 B2 | 5/2005 | Clarke |
| 6,320,428 B1 | 11/2001 | Atsumi et al. | 6,911,682 B2 | 6/2005 | Rueckes et al. |
| 6,322,713 B1 | 11/2001 | Choi et al. | 6,918,284 B2 | 7/2005 | Snow et al. |
| 6,325,909 B1 | 12/2001 | Li et al. | 6,919,284 B2 | 7/2005 | Yamamoto et al. |
| 6,331,209 B1 | 12/2001 | Jang et al. | 6,919,529 B2 | 7/2005 | Franzen et al. |
| 6,333,016 B1 | 12/2001 | Resasco et al. | 6,919,730 B2 | 7/2005 | Cole et al. |
| 6,340,822 B1 | 1/2002 | Brown et al. | 6,919,740 B2 | 7/2005 | Snider |
| 6,342,276 B1 | 1/2002 | You et al. | 6,921,575 B2 | 7/2005 | Horiuchi et al. |
| 6,346,413 B1 | 2/2002 | Fodor et al. | 6,924,538 B2 * | 8/2005 | Jaiprakash et al. ......... 257/415 |
| 6,348,295 B1 | 2/2002 | Griffith et al. | 6,946,410 B2 | 9/2005 | French et al. |
| 6,348,700 B1 | 2/2002 | Ellenbogen et al. | 7,048,999 B2 | 5/2006 | Smalley et al. |
| 6,350,488 B1 | 2/2002 | Lee et al. | 2001/0004979 A1 | 6/2001 | Han et al. |
| 6,354,133 B1 | 3/2002 | Yedur et al. | 2001/0023123 A1 | 9/2001 | Kim |
| 6,358,756 B1 | 3/2002 | Sandhu et al. | 2001/0023986 A1 | 9/2001 | Mancevski |
| 6,361,861 B2 | 3/2002 | Gao et al. | 2002/0055010 A1 | 5/2002 | Gao et al. |
| 6,362,073 B2 | 3/2002 | Kim et al. | 2002/0061441 A1 | 5/2002 | Ogura et al. |
| 6,376,787 B1 | 4/2002 | Martin et al. | 2002/0068170 A1 | 6/2002 | Smalley et al. |
| 6,380,434 B1 | 4/2002 | Chiang et al. | 2002/0081380 A1 | 6/2002 | Dillon et al. |
| 6,394,158 B1 | 5/2002 | Momeni | 2002/0081787 A1 | 6/2002 | Kohl et al. |
| 6,400,088 B1 | 6/2002 | Livingston et al. | 2002/0088938 A1 | 7/2002 | Colbert et al. |
| 6,400,091 B1 | 6/2002 | Deguchi et al. | 2002/0090331 A1 | 7/2002 | Smalley et al. |
| 6,406,776 B1 | 6/2002 | D'Evelyn | 2002/0092983 A1 | 7/2002 | Colbert et al. |
| 6,407,443 B2 | 6/2002 | Chen et al. | 2002/0092984 A1 | 7/2002 | Colbert et al. |
| 6,409,567 B1 | 6/2002 | Amey et al. | 2002/0096634 A1 | 7/2002 | Colbert et al. |
| 6,413,487 B1 | 7/2002 | Resasco et al. | 2002/0098135 A1 | 7/2002 | Smalley et al. |
| 6,417,606 B1 | 7/2002 | Nakamoto et al. | 2002/0102193 A1 | 8/2002 | Smalley et al. |
| 6,420,726 B2 | 7/2002 | Choi et al. | 2002/0102194 A1 | 8/2002 | Smalley et al. |
| 6,421,271 B1 | 7/2002 | Gogl et al. | 2002/0102196 A1 | 8/2002 | Smalley et al. |
| 6,422,450 B1 | 7/2002 | Zhou et al. | 2002/0102353 A1 | 8/2002 | Mauthner et al. |
| 6,423,583 B1 | 7/2002 | Avouris et al. | 2002/0112814 A1 | 8/2002 | Hafner et al. |
| 6,426,134 B1 | 7/2002 | Lavin et al. | 2002/0125805 A1 | 9/2002 | Hsu |
| 6,426,687 B1 | 7/2002 | Osborn | 2002/0130311 A1 | 9/2002 | Lieber et al. |
| 6,432,740 B1 | 8/2002 | Chen | 2002/0130353 A1 | 9/2002 | Lieber et al. |
| 6,440,761 B1 * | 8/2002 | Choi .......................... 438/20 | 2002/0136896 A1 | 9/2002 | Takikawa et al. |
| 6,443,901 B1 | 9/2002 | Fraser | 2002/0160111 A1 | 10/2002 | Sun et al. |
| 6,445,006 B1 | 9/2002 | Brandes et al. | 2002/0172639 A1 | 11/2002 | Horiuchi et al. |
| 6,495,116 B1 | 12/2002 | Herman | 2002/0172963 A1 | 11/2002 | Kelley et al. |
| 6,495,258 B1 | 12/2002 | Chen et al. | 2002/0173083 A1 | 11/2002 | Avouris et al. |

| | | |
|---|---|---|
| 2002/0175323 A1 | 11/2002 | Guillom et al. |
| 2002/0175390 A1 | 11/2002 | Goldstein et al. |
| 2002/0179434 A1 | 12/2002 | Dai et al. |
| 2003/0004058 A1 | 1/2003 | Li et al. |
| 2003/0021141 A1 | 1/2003 | Segal et al. |
| 2003/0021966 A1 | 1/2003 | Segal et al. |
| 2003/0022428 A1 | 1/2003 | Segal et al. |
| 2003/0042834 A1 | 3/2003 | Dean et al. |
| 2003/0091825 A1 | 5/2003 | Shiffler et al. |
| 2003/0108480 A1 | 6/2003 | Baker et al. |
| 2003/0118727 A1 | 6/2003 | Ting et al. |
| 2003/0122111 A1 | 7/2003 | Glatkowski |
| 2003/0124325 A1 | 7/2003 | Rueckes et al. |
| 2003/0124837 A1 | 7/2003 | Rueckes et al. |
| 2003/0132823 A1 | 7/2003 | Hyman et al. |
| 2003/0165074 A1 | 9/2003 | Segal et al. |
| 2003/0180472 A1 | 9/2003 | Zhou et al. |
| 2003/0198812 A1 | 10/2003 | Rueckes et al. |
| 2003/0199172 A1 | 10/2003 | Rueckes et al. |
| 2003/0200521 A1 | 10/2003 | DeHon et al. |
| 2003/0206436 A1 | 11/2003 | Eaton et al. |
| 2003/0234407 A1 | 12/2003 | Vogeli et al. |
| 2003/0236000 A1 | 12/2003 | Vogeli et al. |
| 2004/0007528 A1 | 1/2004 | Bakajin et al. |
| 2004/0023514 A1 | 2/2004 | Moriya et al. |
| 2004/0041154 A1 | 3/2004 | Watanabe et al. |
| 2004/0071949 A1 | 4/2004 | Glatkowski et al. |
| 2004/0075159 A1 | 4/2004 | Vogeli |
| 2004/0077107 A1 | 4/2004 | Vogeli |
| 2004/0085805 A1 | 5/2004 | Segal et al. |
| 2004/0087162 A1 | 5/2004 | Vogeli |
| 2004/0099438 A1 | 5/2004 | Arthur et al. |
| 2004/0104129 A1 | 6/2004 | Gu et al. |
| 2004/0159833 A1 | 8/2004 | Rueckes et al. |
| 2004/0164289 A1 | 8/2004 | Rueckes et al. |
| 2004/0175856 A1 | 9/2004 | Jaiprakash et al. |
| 2004/0181630 A1 | 9/2004 | Jaiprakash et al. |
| 2004/0191978 A1 | 9/2004 | Rueckes et al. |
| 2004/0214366 A1 | 10/2004 | Segal et al. |
| 2004/0214367 A1 | 10/2004 | Segal et al. |
| 2004/0238907 A1 | 12/2004 | Pinkerton et al. |
| 2004/0253167 A1 | 12/2004 | Silva et al. |
| 2004/0265550 A1 | 12/2004 | Glatkowski et al. |
| 2005/0007002 A1 | 1/2005 | Golovchenko et al. |
| 2005/0035344 A1 | 2/2005 | Bertin et al. |
| 2005/0035367 A1 | 2/2005 | Bertin et al. |
| 2005/0035786 A1 | 2/2005 | Bertin et al. |
| 2005/0035787 A1 | 2/2005 | Bertin et al. |
| 2005/0036365 A1 | 2/2005 | Bertin et al. |
| 2005/0037547 A1 | 2/2005 | Bertin et al. |
| 2005/0040874 A1 | 2/2005 | Allison et al. |
| 2005/0041465 A1 | 2/2005 | Rueckes et al. |
| 2005/0041466 A1 | 2/2005 | Rueckes et al. |
| 2005/0047244 A1 | 3/2005 | Rueckes et al. |
| 2005/0052894 A1 | 3/2005 | Segal et al. |
| 2005/0053525 A1 | 3/2005 | Segal et al. |
| 2005/0056825 A1 | 3/2005 | Bertin et al. |
| 2005/0056866 A1 | 3/2005 | Bertin et al. |
| 2005/0056877 A1 | 3/2005 | Rueckes et al. |
| 2005/0058590 A1 | 3/2005 | Sen et al. |
| 2005/0058797 A1 | 3/2005 | Sen et al. |
| 2005/0058834 A1 | 3/2005 | Rueckes et al. |
| 2005/0059176 A1 | 3/2005 | Rueckes et al. |
| 2005/0059210 A1 | 3/2005 | Rueckes et al. |
| 2005/0062035 A1 | 3/2005 | Bertin et al. |
| 2005/0062062 A1 | 3/2005 | Bertin et al. |
| 2005/0062070 A1 | 3/2005 | Bertin et al. |
| 2005/0063210 A1 | 3/2005 | Segal et al. |
| 2005/0063244 A1 | 3/2005 | Bertin et al. |
| 2005/0065742 A1 | 3/2005 | Segal et al. |
| 2005/0068128 A1 | 3/2005 | Yip |
| 2005/0074926 A1 | 4/2005 | Bertin et al. |
| 2005/0095938 A1 | 5/2005 | Rosenberger et al. |
| 2005/0101112 A1 | 5/2005 | Rueckes et al. |
| 2005/0128788 A1 | 6/2005 | Segal et al. |
| 2005/0174842 A1 | 8/2005 | Bertin et al. |
| 2005/0191495 A1 | 9/2005 | Rueckes et al. |
| 2005/0237781 A1 | 10/2005 | Bertin et al. |
| 2005/0269553 A1 | 12/2005 | Sen et al. |
| 2005/0269554 A1 | 12/2005 | Sen et al. |
| 2005/0270824 A1 | 12/2005 | Bertin et al. |
| 2005/0279988 A1 | 12/2005 | Bertin |
| 2005/0280436 A1 | 12/2005 | Bertin |
| 2005/0281084 A1 | 12/2005 | Rueckes et al. |
| 2005/0282515 A1 | 12/2005 | Bertin |
| 2005/0282516 A1 | 12/2005 | Bertin |
| 2006/0044035 A1 | 3/2006 | Bertin |
| 2006/0052509 A1 | 3/2006 | Saitoh |
| 2006/0061389 A1 | 3/2006 | Bertin |
| 2006/0125033 A1 | 6/2006 | Segal et al. |
| 2006/0128049 A1 | 6/2006 | Jaiprakash et al. |
| 2006/0183278 A1 | 8/2006 | Bertin et al. |
| 2006/0193093 A1 | 8/2006 | Bertin et al. |
| 2006/0204427 A1 | 9/2006 | Ghenciu et al. |
| 2006/0231865 A1 | 10/2006 | Rueckes et al. |
| 2006/0237805 A1 | 10/2006 | Segal et al. |
| 2006/0250843 A1 | 11/2006 | Bertin et al. |
| 2006/0250856 A1 | 11/2006 | Bertin et al. |
| 2006/0255834 A1 | 11/2006 | Bertin |
| 2006/0276056 A1 | 12/2006 | Ward et al. |
| 2007/0015303 A1 | 1/2007 | Bertin et al. |

FOREIGN PATENT DOCUMENTS

| | | |
|---|---|---|
| EP | 0269255 | 6/1988 |
| EP | 0296716 | 12/1988 |
| EP | 0315392 | 5/1989 |
| EP | 426282 | 5/1991 |
| EP | 441409 | 8/1991 |
| EP | 0613130 | 8/1994 |
| EP | 0655187 B1 | 5/1995 |
| EP | 0688618 | 12/1995 |
| EP | 758028 | 2/1997 |
| EP | 0945402 | 9/1999 |
| EP | 0947466 | 10/1999 |
| EP | 0989579 | 3/2000 |
| EP | 1046613 | 10/2000 |
| EP | 1052520 | 11/2000 |
| EP | 1054249 | 11/2000 |
| EP | 1059266 | 12/2000 |
| EP | 1061040 | 12/2000 |
| EP | 1061043 | 12/2000 |
| EP | 1061044 | 12/2000 |
| EP | 1061544 | 12/2000 |
| EP | 1061555 | 12/2000 |
| EP | 1069206 | 1/2001 |
| EP | 1072693 | 1/2001 |
| EP | 1096533 | 5/2001 |
| EP | 1100106 | 5/2001 |
| EP | 1100297 | 5/2001 |
| EP | 1132920 | 9/2001 |
| EP | 1205436 | 5/2002 |
| EP | 1209123 | 5/2002 |
| EP | 1225613 | 7/2002 |
| GB | 2364933 | 2/2002 |
| JP | 11011917 | 1/1999 |
| WO | WO-95/02709 | 1/1995 |
| WO | WO-96/38410 | 12/1996 |
| WO | WO-96/41043 | 12/1996 |
| WO | WO-97/09272 | 3/1997 |
| WO | WO-97/22971 | 6/1997 |
| WO | WO-97/31139 | 8/1997 |
| WO | WO-97/43473 | 11/1997 |
| WO | WO-98/26871 | 6/1998 |
| WO | WO-98/39250 | 9/1998 |
| WO | WO-98/39251 | 9/1998 |

| | | |
|---|---|---|
| WO | WO-98/42620 | 10/1998 |
| WO | WO-98/44593 | 10/1998 |
| WO | WO-98/48456 | 10/1998 |
| WO | WO-99/06618 | 2/1999 |
| WO | WO-99/47570 | 9/1999 |
| WO | WO-99/48810 | 9/1999 |
| WO | WO-99/58748 | 11/1999 |
| WO | WO-99/65821 | 12/1999 |
| WO | WO-00/08650 | 2/2000 |
| WO | WO-00/09443 | 2/2000 |
| WO | WO-00/17101 | 3/2000 |
| WO | WO-00/19494 | 4/2000 |
| WO | WO-00/44094 | 7/2000 |
| WO | WO-00/48195 | 8/2000 |
| WO | WO-00/63115 | 10/2000 |
| WO | WO-00/73204 | 12/2000 |
| WO | WO 01/03208 A1 | 1/2001 |
| WO | WO-01/18246 | 3/2001 |
| WO | WO-01/23303 | 4/2001 |
| WO | WO 01/44796 A1 | 6/2001 |
| WO | WO-02/19420 | 3/2002 |
| WO | WO-02/37500 | 5/2002 |
| WO | WO-02/38496 | 5/2002 |
| WO | WO-02/42204 | 5/2002 |
| WO | WO-02/48701 | 6/2002 |
| WO | WO-02/48822 | 6/2002 |
| WO | WO-02/054505 | 7/2002 |
| WO | WO-02/059898 | 8/2002 |
| WO | WO-02/060812 | 8/2002 |
| WO | WO-02/060813 | 8/2002 |
| WO | WO 2004/065657 A1 | 8/2004 |
| WO | WO-2004/065671 | 8/2004 |

OTHER PUBLICATIONS

Avouris, Ph., "Carbon nanotube electronics," Chem. Physics, 2002, vol. 281, pp. 429-445.
Casavant, M.J. et al., "Neat macroscopic membranes of aligned carbon nanotubes," Journal of Appl. Phys., 2003, vol. 93(4), pp. 2153-2156.
Chen, R. J. et al., "Noncovalent Sidewall Functionalization of Single-Walled Carbon Nanotubes for Protein Immobilization," J. Am. Chem. Soc., 2001, vol. 123, pp. 3838-3839.
Choi, W.B. et al., "Carbon-nanotube-based nonvolatile memory with oxide-nitride-film and nanoscale channel," Appl. Phys. Lett., 2003, vol. 82(2), pp. 275-277.
Cui, J.B. et al., "Carbon Nanotube Memory Devices of High Charge Storage Stability," Appl. Phys. Lett., 2002, vol. 81(17), pp. 3260-3262.
Dai, H. et al., "Controlled Chemical Routes to Nanotube Architectures, Physics, and Devices," J. Phys. Chem . B., 1999, vol. 103, pp. 111246-11255.
Dequesnes, M. et al., "Calculation of pull-in voltages for carbon-nanotube-based nanoelectromechanical switches," Nanotechnology, 2002, vol. 13, pp. 120-131.
Dequesnes, M. et al., "Simulation of carbon nanotube-based nanoelectromechanical switches," Computational Nanoscience and Nanotechnology, 2002, pp. 383-386.
Fan, S. et al., "Carbon nanotube arrays on silicon substrates and their possible application," Physica E, 2000. vol. 8, pp. 179-183.
Farajian, A. A. et al., "Electronic transport through bent carbon nanotubes: Nanoelectromechanical sensors and switches," Phys. Rev. B, 2003, vol. 67, pp. 205423-1-205423-6.
Fischer, J.E. et al., "Magnetically aligned single wall carbon nanotube films: Preferred orientation and anisotropic transport properties," Journal of Appl. Phys., 2003,vol. 93(4), pp. 2157-2163.
Franklin, N. R. et al., "Integration of suspended carbon nanotube arrays into electronic devices and electromechanical systems," Appl. Phys. Lett., 2002, vol. 81(5), pp. 913-915.
Fuhrer, M.S. et al., "High-Mobility Nanotube Transistor Memory," Nano Letters, 2002, vol. 2(7), pp. 755-759.

Homma, Y. et al., "Growth of Suspended Carbon Nanotubes Networks on 100-nm-scale Silicon Pillars," Appl. Phys. Lett., 2002, vol. 81(12), pp. 2261-2263.
Kinaret, J.M. et al., "A carbon-nanotube-based nanorelay", Appl. Phys. Lett., 2003, vol. 82(8), pp. 1287-1289.
Lee, K.H. et al., "Control of growth orientation for carbon nanotubes," Appl, Phys. Lett., 2003, vol. 82(3), pp. 448-450.
Radosavljevic, M. et al., "Nonvolatile molecular memory elements based on ambipolar nanotube field effect transistors," Nano Letters, 2002, vol. 2(7), pp. 761-764.
Robinson, L.A.W., "Self-Aligned Electrodes for Suspended Carbon Nanotube Structures," Microelectronic Engineering, 2003, vols. 67-68, pp. 615-622.
Rueckes, T., et al., "Carbon Nanotube-Based Nonvolatile Random Access Memory for Molecular Computing" Science, 2000, vol. 289, pp. 94-97.
Soh, H. T. et al., "Integrated nanotube circuits: Controlled growth and ohmic contacting of single-walled carbon nanotubes," Appl. Phys. Lett., 1999. vol. 75(5), pp. 627-629.
Sreekumar, T.V., et al., "Single-wall Carbon Nanotube Films", Chem. Mater. 2003, vol. 15, pp. 175-178.
Tour, J. M. et al., "NanoCell Electronic Memories," J. Am. Chem Soc., 2003, vol. 125, pp. 13279-13283.
Verissimo-Alves, M. et al., "Electromechanical effects in carbon nanotubes: Ab initio and analytical tight-binding calculations," Phys. Rev. B, 2003, vol. 67, pp. 161401-1-161401-4.
Wolf, S., Silicon Processing for the VLSI Era; vol. 2—Process Integration, Multi-Level-Interconnect Technology for VLSI and ULSI, 1990, Section 4.3 Materials for Multilevel Interconnect Technologies, pp. 189-191, Lattice Press, Sunset Beach.
Wolf, S., Silicon Processing for the VLSI Era; vol. 2—Process Integration, 1990, Section 4.7 Manufacturing Yield and Reliability Issues of VLSI Interconnects, pp. 260-273, Lattice Press, Sunset Beach.
Zhan, W. et al., "Microelectrochemical Logic Circuits," J. Am. Chem. Soc., 2003, vol. 125, pp. 9934-9935.
Zhang, Y. and Hongjie Dai. "Formation of metal nanowires on suspended single-walled carbon nanotubes." Applied Physics Letters , vol. 77 (Nov. 6, 2000): 3015-3017.
"8 Mb Synchronous Communication SRAM (IBM0418A86LQKA, IBM0418A86SQKA, IBM0436A86IQKA, IBM436A86SQKA)." International Business Machines Corp. (IBM), 1999.
"Nanochip NC800SX, 0.8 Gbyte Molecular Memory IC (R/W), Nanochip NC200SX, 0.2 Gbyte Molecular Memory IC (R/W), Nanochip NCM4510SX, Molecular Array Read/write Engine, Low Voltage Thermal Actuated, Dynamic Media Series M2, Nanochip NC4525DX, A/D-D/AInterface. Preliminary Specifications, Advance Information, (C) 1996-2000 Nanochip Document NCM2230500."
"Package Mechanicals for USAR ICs." USAR Systems, Inc., 1998.
"Preliminary: 8Mb (256K.times.36 & 512K.times.18) and 4Mb (128K.times.36 & 256K.times.18) (IBM0418A8CBLBB, IBM0418A4CBLBB, IBM0436A8CBLBB, IBM0436A4CBLBB)." International Business Machines Corp. (IBM), 1998.
"The Ultimate Memory Guide." Kingston Technology (1998).
Advanced Semiconductor Engineering, Inc., Substrate Design 420L BGA 35*35, Dwg. No. K-I-0420, 2 pages, date is not known.
Ago, Hiroki et al. "Gas-Phase Synthesis of Single-wall Carbon Nanotubes from Colloidal Solution of Metal Nanoparticles." Journal of Physical Chemistry B (Nov. 1, 2001); 105, 10453-10456.
Ajayan, P. M. et al. "Nanotubes in a Flash—Ignition and Reconstruction." Science (Apr. 26, 2002); 296, 705.
Ajayan, Pulickel M. and Otto Z. Zhou. "Applications of Carbon Nanotubes." Topics in Applied Physics (2001); 80, 391-425.
An, Lei, "Synthesis of Nearly Uniform Single-Walled Carbon Nanotubes Using Identical Metal-Containing Molecular Nanoclusters as Catalysts," j. Amer. Chem. Soc., 2002, vol. (?), total of 4 pgs.
Avouris, P., "Carbon nanotube electronics," Carbon, 2002, vol. 40, pp. 429-445.

Bahr, Jeffrey L. and James. M. Tour. "Highly Functionalized Carbon Nanotubes Using in Situ Generated Diazonium Compounds." Chemical Materials (2001); 13, 3823-3824.

Bahr, Jeffrey, L., "Functionalization of Carbon Nanotubes by Elecrochemical Reduction of Aryl Diazonium Salts: A Bucky Paper Electrode," American Chemical Society, 2001, vol. 123, pp. 6536-6542.

Batra, Inder P., "Quantum transport through one-dimensional aluminum wires," J. Vac. Sci. Technol., May/Jun. 2002, B 20(3), pp. 812-817.

Bekyarova, E. et al. "Oxidation and Porosity Evaluation of Budlike Single-Wall Carbon Nanohorn Aggregates." American Chemical Society (2002).

Benerjee, Sarbajit and Stanislaus S. Wong. "Functionalization of Carbon Nanotubes with a Metal-Containing Molecular Complex." Nano Letters (2001); 0, A-E.

Berber, Savas, "Unusually High Thermal Conductivity of Carbon Nanotubes," Physical Review Letters, May 15, 2000, vol. 84, No. 20, pp. 4613-4616.

Bergbreiter, David E., "Using Soluble Polymers To Recover Catalysts and Ligands," Chemical Reviews, Mar. 5, 2002, pp. A-AM.

Bernholc et al., Mechanical and electrical properties on nanotubes, Annu. Rev. Mater. Res., 32 (2002) 347-375.

Berry, A.D., "Fabrication of GaAs and InAs wires in nanochannel gas," Applied Physics Letters, No. 4, 1996, vol. 69, pp. 2846-2848.

Blick, R.H., "Nanostructural silicon for studying fundamental aspects of nanomechanics," J. of Physics: Condensed Matter, (2002), pp. R905-R945.

Bonard, J. et al., "Monodisperse Multiwall Carbon Nanotubes Obtained with Ferritin as Catalyst", Nano Letters, 2002, vol. 2, No. 6, 665-667.

Bozler, C.O. et al., "Fabrication and Microwave Performance of the Permeable Base Transistor," IEEE Tech. Dig. Int. Electron Devices Meeting (1979) 384.

Bozovic, Dolores et al. "Electronic properties of mechanically induced kinds on single-walled carbon nanotubes." Applied Physics Letters (Jun. 4, 2001); 78, 3693-3695.

Brown, David A. et al. "Kinetics of Inron(III) Chelation from Polynuclear Oxo-Hydroxy Aggregates by Hydroxamic Acids." Inorganic Chemistry (1999); 38, 5198-5202, date is not known.

Callaby, D. Roy et al. "Solid State Memory Study Final Report." National Media Lab, Feb. 1994.

Calleja, M., "Fabrication of gold nanowires on insulating substrates by field-induced mass transport," Applied Physics Letters, Oct. 8, 2001, vol. 79, pp. 2471-2473.

Cao, Anyuan et al. "Macroscopic Three-Dimensional Arrays of Fe Nanoparticles Supported in Aligned Carbon Nanotubes." The Journal of Physical Chemistry B (2001); 105, 11937-11940.

Cassell, A., et al., "Directed Growth of Free-Standing Single-Walled Carbon Nanotubes." Journal of the American Chemical Society (1999); vol. 121, 7975-7976.

Cassell, Alan M. et al. "Large Scale CVD Synthesis of Single-Walled Carbon Nanotubes." American Chemical Society (1999): 6484-6492.

Cassell, Alan M., "Combinatorial Optimization of Heterogeneous Catalysts Used in the Growth of Carbon Nanotubes," Langmuir 2001, vol. 17, pp. 260-264.

Charlier, Jean-Christophe and Sumio Iijima. "Growth Mechanisms of Carbon Nanotubes." Topics in Applied Physics (2001); 80, 55-81.

Chattopadhyay, et al., "Metal-Assisted Organization of Shortened Carbon Nanotubes in Monolayer and Multilayer Forest Assemblies", Journal of the American Chemical Society, Aug. 28, 2001, vol. 123, 9451-9452.

Chen, B., et al., "Heterogeneous Single-Walled Carbon Nanotube Catalyst Discovery and Optimization." Chem. Mater. (2002); vol. 14, 1891-1896.

Chen, J. et al., "Large On-Off Ratios and Negative Differential Resistance in a Molecular Electronic Device," Science, vol. 286, Nov. 19, 1999, pp. 1550-151.

Chen, Robert J. et al. "Molecular photodesorption from single-walled carbon nanotubes." Applied Physics Letters (Oct. 1, 2001): 2258-2260.

Cheng, H. M. et al. "Large-scale and low-cost synthesis of single-walled carbon nanotubes by the catalyst pyrolysis of hydrocarbons." Applied Physics Letters (Jun. 22, 1998); 72, 3282-3284.

Cheung. Chin Li et al. "Growth and fabrication with single-walled carbon nanotube probe microscopy tips." Applied Physics Letters (2000); 76, 3136-3138.

Chiang, I.W., "Purification and Characterization of Single-Wall Carbon Nanotubes (SWNTs) Obtained from the Gas-Phase Decomposition of CO (HiPco Process)," J. Phys. Chem. B 2001, vol. 105, pp. 8297-8301.

Choi, Hee Cheul, "Spontaneous Reduction of Metal Ions on the Sidewalls of Carbon Nanotubes," J. Amer. Chem. Soc., May 7, 2002, pp. A-B.

Ci, Lijie, "Double Wall Carbon Nanotubes Promoted by Sulfur in a Floating Iron Catalyst CVD System," Chemical Physics Letters 359, Jun. 13, 2002, pp. 63-67.

Ciraci, S., "Quantum effects in electrical and thermal transport through nanowires," J. of Physics: Condensed Matter, (2001), pp. R537-R568.

Cleland, A.N., "Single-crystal aluminum nitride nanomechanical resonators," Applied Physics Letters, Sep. 24, 2001, vol. 79, pp. 2070-2072.

Collier, C.P., et al., "Electronically Configurable Molecular-Based Logic Gates," Science, vol. 285, Jul. 16, 1999, pp. 391-394.

Collins, P., "Engineering Carbon Nanotubes and Nanotube Circuits Using Electrical Breakdown", Science, vol. 292, Apr. 27, 2001, pp. 706-709.

Colomer, J. F., "Different Purification Methods of Carbon Nanotubes Produced by Catalytic Synthesis," Synthetic Metals 103, 1999, pp. 2482-2483.

Colomer, J.-F., et al., "Characterization of Single-Walled Carbon Nanotubes Produced by CCVD Method," Chemical Physics Letters (2001); 345, 11-17.

Connelly, Neil G., "Chemical Redox Agents for Organometallic Chemistry," Chemical Reviews, Jan. 9, 1996, vol. 96, pp. 877-910.

Crystal Growth, Wafer Fabrication and Basic Properties of Silicon Wafers, Chapter 3, pp. 93-149, date is not known.

Cui, Yi et al. "Functional Nanoscale Electronic Devices Assembled Using Silicon Nanowire Building Blocks." Science (2001); 291: 851-53.

Cui, Yi. " Doping and Electrical Transport in Silicon Nanowires." The Journal of Physical Chemistry B (2000); vol. 104, No. 22: 5213-5216.

Dai, Hongje et al. "Exploiting the properties of carbon nanotubes for nanolithography." Applied Physics Letters (Sep. 14, 1998); 73, 1508-1510.

Dai, Hongje. "Controlled Chemical Routes to Nanotube Architectures, Physics, and Devices." The Journal of Physical Chemistry B (1999); 103: 11246-11255.

Dai, Hongje. "Nanotube Growth and Characterization." Topics in Applied Physics (2001); 80, 29-53.

Dalton, A.B., "A Functional Conjugated Polymer to Process, Purify and Selectively Interact with Single Wall Carbon Nanotubes," Synthetic Metals 121, 2001; pp. 1217-1218.

De Vos, Dirk E., "Ordered Mesoporous and Microporous Molecular Sieves Functionalized with Transition Metal Complexes as Catalysts for Selective Organic Transformations," Chemical Reviews, Jan. 31, 2002, pp. A-Z.

Delzeit, L., et al., "Multilayered Metal Catalysts for Controlling the Density of Single-walled Carbon Nanotube Growth." Chemical Physics Letters, 348, 368, 2001.

Deng, S. Z., "Synthesis of silicon carbide nanowires in a catalyst-assisted process," Chemical Physics Letters, Apr. 26, 2002, vol. 356, pp. 511-514.

Derycke, V. et al. "Carbon Nanotube Inter-and Intramolecular Logic Gates." Nano Letters (Sep. 2001); 1, 453-456.

Derycke, V., "Catalyst-Free Growth of Ordered Single-Walled Carbon Nanotube Networks," Nano Letters, 2002, pp. A-D.

Desai et al., "Freestanding Carbon Nanotube Specific Fabrication," Proc. of 2005 5th IEEE Conf., Nanotech., Nagoya, Japan, pp. 1-4, Jul. 2005.

Diehl, Michael R. et al. "Self-Assembled, Deterministic Carbon Nanotube Wiring Networks." Angew. Chemical International Edition (2002); 41, 353-356.

Dillon, Anne C., "A Simple and Complete Purification of Single-Walled Carbon Nanotube Materials," Advanced Materials, 1999, vol. 11, pp. 1354-1358.

Dinaro, Joanna, "Analysis of an Elementary Reaction Mechanism for Benzene Oxidation in Supercritical Water, Combustion Institute," 2000, vol. 28, pp. 1529-1536.

Dipert, Brian. "Exotic Memories, Diverse Approaches." EDN Magazine. Apr. 26, 2001, 56-70.

Dipert, Brian. "Memory Cards: Designing with a Full Deck." EDN Magazine. May 25, 2000.

Douglas, Trevor and Vistorai T. Stark. "Nanophase Cobalt Oxyhydroxide Mineral Synthesized within the Protein Cage of Ferritin." Inorganic Chemistry (2000); 39, 1828-1830.

Dresselhaus, M.S., "Raman Spectroscopy on One Isolated Carbon Nanotube," Pysica B 323, 2002, pp. 15-20.

Dresselhaus, Mildred S. and Morinobu Endo. "Relation of Carbon Nanotubes to Other Carbon Materials." Topics in Applied Physics (2001); 80, 11-28.

Dresselhaus, Mildred S. and Phaedon Avouris. "Introduction to Carbon Materials Research." Topics Applied Physics (2001); 80, 1-9.

Dresselhaus, Mildred S., Preface (Publication unknown) Jan. 2001.

Duan, Xiangfeng, "Indium phosphide nanowires as building blocks for nanoscale electronic and optoelectronic devices," Nature, Jan. 4, 2001, vol. 409, pp. 66-69.

Duan, Xiangfeng, "Nonvolatile Memory and Programmable Logic from Molecule-Gated Nanowires," Nano Letters, 2002, pp. A-D.

Duan, Xiangfeng. "Indium Phosphide Nanowires as Building Blocks for Nanoscale Electronic and Optoelectronic Devices." Nature (2001); 409: 66-69.

Dubois, S., "Fabrication and properties of arrays of superconducting nanowires," Journal of Materials Research Mar. 1999, vol. 14, pp. 665-671.

Durkop, T., "Nanotubes are High Mobility Semiconductors," Department of Physics, University of Maryland, 4 pgs., date is not known.

Erkoc et al., Int. J. Modern Phys. C, 12:865-870 (2001).

Fan, Hongyou, "Multiphased assembly of nanoporous silica particles," Journal of Non-Crystalline Solids (2001) vol. 285, pp. 71-78.

Fan, Shoushan et al. "Self-Oriented Regular Arrays of Carbon Nanotubes and Their Field Emission Properties." Science (Jan. 22, 1999); 283, 512-514.

Filho, A. G. Souza et al. "Electronic transition energy Eli for an Isolated (n, m) single-wall carbon nanotube obtained by anti-Stokes/Stokes resonant Raman intensity ratio." Physical Review (2002); 63, 241404(4).

Fink, Joerg H. and Philippe Lambin. "Electron Spectroscopy Studies of Carbon Nanotubes." Topics in Applied Physics (2001); 80, 247-272.

Flahaut, E. et al. "Synthesis of single-walled carbon nanotube-Co-MgO composite powders and extraction of the nanotubes." Journal of Chemical Materials (2000); 10, 249-252.

Forro, Laszlo and Christian Schoenenberger. "Physical Properties of Multi-wall Nanotubes." Topics in Applied Physics (2001); 80, 329-391.

Franklin, Nathan R. and Hongje Dai, "An Enhanced CVD Approach to Extensive Nanotube Networks with Directionality." Advanced Materials (2000): 890-894.

Franklin, Nathan R. et al. "Patterned growth of single-walled carbon nanotubes on full 4-inch wafers." Applied Physics Letters (Dec. 31, 2001); 79, 4571-4573.

Fruchart, O., "Vertical self-organization of epitaxial magnetic nanostructures," Journal of Magnetism and Magnetic Materials, 2002, vol. 239, pp. 224-227.

Fu, Qiang, "Electrodeposition of Carbon Films from Various Organic Liquids," Surface & Coatings Technology 124, 2000, pp. 196-200.

Gromov, A., "Purification of Carbon Nanotubes," Caramel Workshop, Jan. 23, 2002, pp. 1-13.

Haddon, R. C. "C70 Thin Film Transistors." Journal of the American Chemical Society (1996); 118, 3041-3042.

Hafner, J.H. et al. "Structural and functional imaging with carbon nanotube AFM probes." Progress in Biophysics & Molecular Biology (2001): 77, 73-110.

Hafner, Jason H. et al. "Catalytic growth of single-wall carbon nanotubes from metal particles." Chemical Physics Letters (Oct. 30, 1998); 296, 195-202.

Hafner, Jason H. et al. "Direct Growth of Single-Walled Carbon Nanotube Scanning Probe Microscopy Tips." Journal of the American Chemical Society (1999); 121, 9750-9751.

Hafner, Jason H. et al. "Growth of nanotubes for probe microscopy tips." Scientific Correspondence (Apr. 29, 1999); 398, 761-762.

Hafner, Jason H. et al. "High-Yield Assembly of Individual Single-Walled Carbon Nanotube Tips for Scanning Prone Microscopies." The Journal of Physical Chemistry (Feb. 1, 2001); 105, 743-746.

Harutyunyan, Avetik R., "CVD Synthesis of Single Wall Carbon Nanotubes under "Soft" Conditions," Nano Letters, Feb. 25, 2002, pp. A-F.

Hatzikonstantinidou et al., Phys. Scripta 54: 226-229 (1994).

He, J. Z., "Dispersion, refinement, and manipulation of single silicon nanowires," Applied Physics Letters, Mar. 11, 2002, vol. 80, pp. 1812-1814.

Heinze, S., "Carbon Nanotubes as Schottky Barrier Transistors," Physical Review Letters, Sep. 2, 2002, vol. 89, No. 10, 106801-1-106801-4.

Hernadi, K., "Reactivity of Different Kinds of Carbon During Oxidative Purification of Catalytically Prepared Carbon Nanotubes,", Solid State Ionics 141-142, 2001, pp. 203-209.

Homma, Y., "Single-Walled Carbon Nanotube Growth on Silicon Substrates Using Nanoparticle Catalysts", Jpn. J. Appl. Phys., vol. 41 (2002), pp. L89-L91.

Hone, James. "Phonons and Thermal Properties of Carbon Nanotubes." Topics of Applied Physics (2001); 80, 273-286.

Hou, P. X., "Multi-step purification of carbon nanotubes," 2002 Elsevier Science Ltd., Mar. 8, 2001, vol. 40, pp. 81-85.

Hu, Jiangtao et al. "Controlled Growth and Electrical Properties of Heterojunctions of Carbon Nanotubes and Silicon Nanowires." Nature (1999); 399: 48-51.

Huang, et al., "Patterned Growth of Well-Aligned Carbon Nanotubes: A Soft-Lithographic Approach", The Journal of Physical Chemistry B., Mar. 16, 2000, vol. 104, No. 10, 2193-2196.

Huang, Houjin, "Purification and alignment of arc-synthesis single-walled carbon nanotube bundles," Chemical Physics Letters,2002, vol. 356, pp. 567-572.

Huang, Yu et al. "Directed Assembly of One-Dimensional Nanostructures into Functional Networks." Science (2001); 291: 630-33.

Hyeon-Lee, Jingyu, "Aero-Sol-Gel Synthesis of Nanostructured Silica Powders," Chemical Materials, 1997, vol. 9, pp. 2400-2403.

Integrated Device Technology, Inc., BG Package Outline, Feb. 18, 1994.

Integrated Device Technology, Inc., DA Package Design, Sep. 25, 1997, 2 pages.

Introduction and Historical Perspective, Chapter 1, pp. 1-48, date is not known.

Javey, A., et al., "Carbon Nanotube Transistor Arrays for Multistage Complementary Logic and Ring Oscillators." Nano Letters (2002); vol. 2 No. 9 929-931. Published on web Jul. 31, 2002.

Javey, Ali, "Carbon Nanotube Transistor Arrays for Multistage Complementary Logic and Ring Oscillators." Nano Letters, 2002, pp. A-D.

Jorio, A. et al. "Joint density of electronic states for one isolated single-wall carbon nanotube studied by resonant Raman scattering." Physical Review B (2001); 63: 24541(4).

Jorio, A. et al. "Structural (n, m) Determination of Isolated Single-Wall Carbon Nanotubes by Resonant Raman Scattering." Physical Review Letters (Feb. 5, 2001); 86, 1118-1121.

Jorritsman, J., "Fabrication of large arrays of metallic nanowires on V-grooved substrates," Applied Physics Letters, Sep. 4, 1995, vol. 67, pp. 1489-1491.

Joselevich, Ernesto, "Vectorial Growth of Metallic and Semiconducting Single-Wall Carbon Nanotubes," Nano Letters, xxxx, vol. 0, pp. A-E, date in not known.

Kaneto, K. et al., "Electrical conductivities of multi-wall carbon nanotubes", Synthetic Metals, Elsevier Science S.A. (1999), vol. 103, pp. 2543-2546.

Kiang, Ching-Hwa. "Growth of Large-Diameter Single-Walled Carbon Nanotubes." American Chemical Society (2000); 104, 2454-2456.

Kim, Philip et al. "Nanotubes Nanotweezers." Science (1999); 286: 2148-2150.

Kim, W., et al., "Synthesis of Ultralog and High Percentage of Semiconduction Single-walled Carbon Nanotubes." Nano Letters (2002); vol. 2 No. 7 703-708. Published on web Jun. 1, 2002.

Kluth, P., "Fabrication of epitaxial $CoSi_2$ nanowires," Applied Physics Letters, Aug. 6, 2001, vol. 79, pp. 824-826.

Kong, J. et al. "Synthesis, integration, and electrical properties of individual single-walled carbon nanotubes." Applied Physics A (1999); 69, 305-308.

Kong, J., et al., "Syntheses of Individual Single-Walled carbon Nanotubes on Patterned Wafers." Nature (1998); 395: 878-881.

Kong, Jing et al. "Quantum Interference and Ballistic Transmission in Nanotube Electron Waveguides." Physics Review Letters (Sep. 3, 2001); 87, 106801(4).

Kong, Jing, "Chemical vapor deposition of methane for single-walled carbon nanotubes," Chemical Physics Letters, 1998, vol. 292, pp. 567-574.

Kong, Jing; Chongwu Zhou; Erhan Yenilmez; Hongje Dai. "Alkaline metal-doped n-type semiconducting nanotubes as quantum dots." ApplieDPhysics Letters (Dec. 11, 2000): 3977-3979.

Legrand, B., "Silicon nanowires with sub 10 nm lateral dimensions: From atomic force microscope lithography based fabrication to electrical measurements," J. Vac. Sci. Technol., May/Jun. 2002, B 20(3), pp. 862-870.

Lei, Y, Fabrication, characterization, and photoluminescence properties of highly ordered $TiO_2$ nanowire arrays, J. Material Research, Apr. 2001, vol. 16, pp. 1138-1144.

Lei, Y., "Fabrication, characterization and Raman study of $TiO_2$ nanowire arrays prepared by anodic oxidative hydrolosis of $TiCl_3$," Chemical Physics Letters, 2001, vol. 338, pp. 231-236.

Lewenstein, Justin C. High-Yield Selective Placement of Carbon Nanotubes on Pre-Patterned Electrodes, Nano Letters., 2002, vol. 2, No. 5, pp. 443-446.

Li, C.P., "Silicon Nanowires Wrapped with Au Film," J. Phys. Chem. B 2002, vol. 106, pp. 6980-6984.

Li, Jian-Long, "Spontaneous formation of ordered indium nanowire array on Si(001)," Applied Physics Letters, Oct. 22, 2001, vol. 79, pp. 2826-2828.

Li, Jun, "Novel Three-Dimensional Electrodes: Electrochemical Properties of Carbon Nanotube Ensembles," J. Phys. Chem. B 2002, pp. A-G.

Li, Mingtao et al. "Direct Three-dimensional Patterning Using Nanoimprint Lithography." Applied Physics Letters (2000); vol. 78, No. 21: 3322-3324.

Li, Shoutain et al. "Semiconductor Nanoparticles in Contact: Quenching of the Photoluminescence from Silicon Nanocrystals by WO3 nanoparticles Suspended in Solution." The Journal of Physical Chemistry B (1998); 102, 7319-7322.

Li, Y. et al., "Preparation of Monodispersed Fe-Mo Nanoparticles as the Catalyst for CVD Synthesis of Carbon Nanotubes." Chem. Mater., 12. 1008, 2001.

Li, Y., "Fabrication of Highly ordered ZnO nanowire arrays in anodic alumina membranes," J. Materials Research, Nov. 2000, vol. 15, p. 2305-2308.

Li, Yiming et al. "Growth of Single-Walled Carbon Nanotubes from Discrete Catalytic Nanoparticles of Various Sizes." American Chemical Society (2001).

Li. Q., et al., "High-Density Growth of Single-Wall Carbon Nanotubes on Silicon by Fabrication of Nanosized Catalyst Thin Films." Chem. Mater. (2002), 14, 4262; Published on web Sep. 11, 2002.

Li., Y., et al., "Growth of Single-Walled Carbon Nanotubes from Discrete Catalytic Nanoparticles of Various Sizes." The Journal of Physical Chemistry B (2001); 105, 11424.

Liu, C. et al. "Synthesis of Macroscopically Long Ropes of Well-Aligned Single-Walled Carbon Nanotubes." Advanced Materials (Aug. 16, 2000); 12, 1190-1192.

Liu, et al., "Organizing Single-Walled Carbon Nanotubes on Gold Using a Wet Chemical Self-Assembling Technique, Langmuir," Apr. 18, 2000, vol. 16, No. 8, 3659-3573.

Liu, Lei et al. "Controlled Reversibility of an sp2 to sp3 Transition of a single Wall Nanotube under the Manipulation of an AFM Tip." Physical Review Letters (May 22, 2000): 4950-4953.

Liu, Z.Q., "Synthesis of $\alpha\text{-}SiO_2$ nanowires using Au nanoparticle catalysts of a silicon substrate," Journal of Materials Research, Mar. 2001, vol. 16, pp. 683-686.

Louie, Steven G. "Electronic Properties, Junctions, and Defects of Carbon Nonotubes." Topics in Applied Physics (2001); 80, 113-145.

Marsen, Bjorn, "Fullerene-Structured Nanowires of Silicon," Physical Review B, Oct. 15, 1999, vol. 60, No. 16, pp. 11593-11600.

Martel, R. et al., "Carbon Nanotube Field-Effect Transistors and Logic Circuits", DAC, vol. 7.4m, pp. 94-98, Jan. 2002.

Martino, Anthony, "Catalyst Testing of Highly Dispersed Metal Nanoparticles for Coal Liquefaction and Coal/Waste Copressing," Catalysis and Chemical Technologies Department, Sandia National Laboratories, pp. 1-7, date is not known.

Massot, L., "Electrodeposition of carbon films from molten alkaline fluoride media," Electrochimica Acta, Jan. 28, 2002, vol. 47, pp. 1949-1957.

Maurin, I., "Carbon Miscibility in the Boron Layers of the $MgB_2$ Superconductor," Chemical Materials, 2002, pp. A-D.

McEuen, Paul L, Single-Wlled Carbon Nanotube Electronics, to be published in the inaugural issue of the IEEE Transactions on Nanotechnology (2002), 9 pgs.

Modern CMOS Technology, Chapter 2, pp. 49-92, date is not known.

Monthioux, M., "Sensitivity of single-wall carbon nanotubes to chemical processing: an electron microscopy investigation," Carbon, 2001, vol. 39, pp. 1251-272.

Moore, Gordon, E., "Cramming more components into integraded circuits," Electronics, Apr. 19, 1965, vol. 38, No. 8(4), 4 pgs.

Morales, Alfredo et al. "A Laser Ablation Method for the Synthesis of Crystalline Semiconductor Nanowires," Science (1988); 279: 208-11.

Murphy, Robert, "High-Yield, Nondestructive Purification and Quantification Method for Multiwalled Carbon Nanotubes," J. Phys. Chem. B 2002, vol. 106, pp. 3087-3091.

Namatsu, Hideo, "Fabrication of one-dimensional nanowire structures utilizing crystallographic orientation in silicon and their conductance characteristics," J. Vac. Sci. Technol., Sep./Oct. 1997, B 15(5), pp. 1688-1696.

Namatsu, Hideo, "Fabrication of thickness-controlled silicon nanowires and their characteristics," J. Vac. Sci. Technol., Nov./Dec. 1995, B 13(6), pp. 2166-2169.

Nerushev, Oleg A. et al. "Carbon nanotube films obtained by thermal chemical vapor deposition." Journal of Chemistry Materials (2001); 11, 1122-1132.

Ng, Hou Tee et al. "Soft-Lithography-Mediated Chemical Vapor Deposition of Architectural Carbon Nanotube Networks on Elastomeric Polymer." American Chemical Society (2001).

O'Connell, Michael J., "Reversible water-solubilization of single-walled carbon nanotubes by polymer wrapping," Chemical Physics Letters, 2001, vol. 342, pp. 265-271.

Odom, Teri Wang et al. "Atomic Structure and Electronic Properties of Single-Walled Carbon Nanotubes." Nature (1998); 391: 62-64.

Odom, Teri Wang et al. "Magnetic Clusters on Single-Walled Carbon Nanotubes: The Kondo Effect in a One-Dimensional Host." Science (2000); 290: 1549-1552.

Odom, Teri Wang et al. "Scanning Probe Microscopy Studies of Carbon Nanotubes." Topics in Applied Physics ((2001); 80, 173-211.

Onoa et al., "Bulk Production of Singly Dispersed Carbon Nanotubes with Prescribed Lengths", Nanotechnology, vol. 16, p. 2799-2803, 2005.

Oullette, Jennifer. "Exploiting Molecular Self-Assembly." The Industrial Physicist. American Institute of Physics, Dec. 2000.

Ouyang, Min. "Atomically Resolved Single-Walled Carbon Nanotube Intramolecular Junctions." Science (2001); 291: 97-100.

Peigney, Alain et al. "A Study of the Formation of Single- and Double-Walled Carbon Nanotubes by a CVD Method." Journal of Physical Chemistry B (2001); 105, 9699-9710.

Peng, Shu et al. "Chemical Control of Nanotube Electronics." Nanotechnology (2000); 11: 57-60.

Peng, X.S., "Electrochemical fabrication of ordered $Ag_2S$ nanowire arrays," Materials Research Bulletin, 2002, No. 37, pp. 1369-1375.

Pimenta, M.A., "Diameter dependence of the Raman D-band in isolated single-wall carbon nanotubes," Physical Review B, vol. 64 pp. 04140-1-04140-4, date is not known.

Postma, Henk W. C. et al. "Manipulation and imaging of Individual Single-Walled Carbon Nanotubes with an Atomic Force Microscope." Advanced Materials (Sep. 1, 2000); 12, 1299-1302.

Puntes, Victor F., "Synthesis of hcp-Co nanodisks," J. Amer. Chem. Soc., 2002, vol. 124, pp. 12874-12880.

Ramsperger, U., "Fabrication and lateral electronic transport measurements of gold nanowires," Applied Physics Letters, Jan. 1, 2001, vol. 78, pp. 85-87.

Rao, C. N. R. et al. "Nanotubes." CHEMPHYCHEM (2001); 2, 78-105.

Reynoso, J. 391PGA Drawings (3): Project No. 32639103, Kyocera America, Inc. (Apr. 12, 1994).

Robertson, John, "Section 11. Non-Crystalling Carbon, Properties and Prospects for Non-Crystalline Carbons," Journal of Non-Crystalline Solids 299-302, 2002, pp. 798-804.

Roucoux, Alain, "Reduced Transition Metal Colloids: A Novel Family of Reusable Catalysts?," Chemical Reviews, Jan. 30, 2002, pp. A-V.

Saito, R. et al. "Chirality-dependent G-band Raman intensity of carbon nanotubes." Physical Review (2001); 64, 085312(7).

Saito, Riichiro and Hiromichi Kataura. "Optical Properties and Raman Spectroscopy of Carbon Nanotubes." Topics in Applied Physics (2001); 80, 213-247.

Sax, Herald, "Polysilicon Overfill Etch Back Using Wet Chemical Spin-process Technology," (7 pages), date is not known.

Schonenberger, Christian et al. "Physics of Multiwall Carbon Nanotubes." Physics World. Apr. 4, 2000.

Sekiba, Daiichiro, "Fabrication of stable nanopatterns on metals," Applied Physics Letters, Sep. 30, 2002, vol. 81, pp. 2632-2634.

Sellmyer, D.J., "Magnetism of Fe, Co and Ni nanowires in self-assembled arrays," J. of Physics: Condensed Matter, (2000) vol. 13, pp. R433-R460.

Serp, Philippe, "Chemical Vapor Deposition Methods for the Controlled Preparation of Supported Catalytic Materials," Chemical Reviews, Apr. 10, 2002, pp. A-AR.

Shim, Moonsub et al. "Polymer Functionalization for Air-Stable n-Type Carbon Nanotube Field-Effect Transistors." Journal of American Chemical Society (2001); 123, 11512-11513.

Shipley, Microposit.RTM. XP-90104A E-Beam Resist, Preliminary Product Information, pp. 1-2, date is not known.

Sidorov, S. N. et al. "Cobalt Nanoparticle Formation in the Pores of Hyper-Cross-Linked Polystyrene." Chemical Materials (1999); 11, 3210-3215.

Smalley, R. E., Foreword (Publication unknown), Jan. 2001.

Snow, E.S. et al. "Chemical Detectin with a Single-Walled Carbon Nanotube Capacitor", Science, Mar. 25, 2005, pp. 1942-1945, vol. 307.

Snow, E.S. et al., "Chemical Detection Using Single-Walled Carbon Nanotubes", Naval Research Laboratory, Washington, DC 20375, pp. 376-379.

Sohm, Jung Inn, et al., "Patterned selective growth of carbon nanotubes and large field emission from vertically well-aligned carbon nanotube field emitter arrays." Appl. Phys. Letters (Feb. 12, 2001); 78, 901-903.

Steuerman, David W., "Interactions between Conjugated Polymers and Single-Walled Carbon Nanotubes," J. Phys. Chem. B 2002, vol. 106, pp. 3124-3130.

Su., M., et al., "A Scalable CVD Method for the Synthesis of Single-Walled Carbon Nanotubes with High Catalyst Productivity." Chemical Physics Letters (2000); vol. 322, 231-326.

Table of Contents for Semiconductor Consulting Services (1999).

Tans, Sander J., " Room-temperature transistor based on a single carbon nanotube," Nature, May 1998, vol. 393, pp. 49-52.

Tat, Kerk Wai, "Preparation and Characterization of Cobalt/Silica Core-Shell Magnetic Nanopartices," Dept. Chem., National University of Singapore 2000/2001, pp. 1-5.

Tenne, Richard and Alex K. Zettl. "Nanotubes from inorganic Materials." Topics in Applied Physics (2001); 80, 81-112.

Tombler, Thomas W.; Chongwu Zhou; Jing Kong; Hongjie Dai. "Gating individual nanotubes and crossed with scanning probes." Applied Physics Letters (Apr. 24, 2000): 2412-2414.

Tsutsumi, Toshiyuki, "Fabrication technology of ultrafine $SiO_2$ masks and Si nanowires using oxidation of vertical sidewalls of a poly-Si layer," J. Vac. Sci. Technol., Jan./Feb. 1999, B 17(1), pp. 77-81.

Tulchinsky, D.A., "Fabrication and domain imaging of iron magnetic nanowire arrays," J. Vac. Sci. Technol., May/Jun. 1998, A 16(3), pp. 1817-1819.

Tyagi et al. "A 130nm Generation Logic Technology Featuring 70nm Transistors, Dual Vt Transistors and 6 Layers of Cu Interconnects." Portland Technology Development, unknown date.

Untiedt, C., "Fabrication and Characterization of Metallic Nanowires," Physical Review B, Jul. 15, 1997, vol. 56, No. 4, pp. 2154-2160.

Wang, Suhua, Thermal Oxidation of $Cu_2S$ nanowires: a Template Method for the Fabrication of Mesoscopic $Cu_xO$ $(\times=1,2)$ Wires, Phys. Chem. Chem. Phys., 2002, vol. 4, pp. 3425-3429.

Wang, Y.W., "Fabrication of Ordered Ferromagnetic-Nonmagnetic Alloy Nanowire Arrays and their Magnetic Property Dependence on Annealing Temperature," J. Phys. Chem. B 2002, vol. 106, pp. 2502-2507.

Wei, B. Q. et al. "Organized assembly of carbon nanotubes." Nature (Apr. 4, 2002); 416, 495-496.

Wei, Chengyu et al. "Temperature and Stain-Rate Dependent Plastic Deformation for Carbon Nanotube." , unknown date.

Wei, Y., et al., "Effect of Catalyst Film Thickness on Carbon Nanotube Growth by Selective Area Chemical Vapor Deposition." Applied Physics Letters (2001); vol. 78, pp. 1394-1396.

Whatmore, Roger W. "Nanotechnology." Ingenia. Feb. 2000.

Wind, S. J., "Fabrication and Electrical Characterization of Top Gate Single-Wall Carbon Nanotube Field-Effect Transistors," IBM T. J. Watson Research Center, 14 pgs, unknown date.

Wind, S.J., "Localized and Directed Lateral Growth and Carbon Nanotubes from a Porous Template," IBM T.J. Watson Research Center, 17 pgs, unknown date.

Wong, Eric et al. "Nanobeam Mechanics: Elasticity, Strength, and Toughness of Nanorods and Nanotubes." Science (1997); 277: 1971-1975.

Woolley, Adam T. et al. "Structural biology with carbon nanotube AFM probes." Chemistry & Biology (2000); 7, R193-204.

Yang. "A High Performance 180 nm Generation Logic Techology." Portland Technology Development, unknown date.

Yao, B. D. and N. Wang. "Carbon Nanotube Arrays Prepared by MWCVD." Journal of Physical Chemistry (2001); 105, 11395-11398.

Yao, Z., et al, Phys. Rev. Lett, 84, 2941 (2000).

Yao, Zhen et al. "Electrical Transport Through Single-Wall Carbon Nanotubes." Topics in Applied Physics (2001); 80, 147-171.

Yao, Zhen, "High-Field Electrical Transport in a Single-Wall Carbon Nanotubes," Physical Review Letters, Mar. 27, 2000, vol. 84, No. 13, pp. 2641-2944.

Yenilmez, E., et al., "Wafer Scale Production of carbon Nanotube Scanning Probe Tips for Atomic Force Microscopy." Applied Physica Letters. (2002); vol. 80 No. 12, 2225-2227.

Yin, A. J., "Fabrication of highly ordered metallic nanowire arrays by electrodeposition," Applied Physics Letters, Aug. 31, 2001, vol. 79, pp. 1039-1041.

Yoshida, Jun-ichi, "Tag Strategy for Separation and Recovery," Chemical Reviews, Mar. 18, 2002, pp. A-X.

Yu, et al., J. Phys. Chem. B, 105:6831-6837 (2001).

Yu, Jae-Young, "Silicon Nanowires: Preparation, Device, Fabrication, and Transport Properteis," J. Phys. Chem. B 2000, vol. 104, pp. 11864-11870.

Yu, Zhonghua, "(n, m) Structural Assignments and Chirality Dependence in Single-Wall Carbon Nanotube Raman Scattering," J. Phys. Chem. B 2001, vol. 105, pp. 6831-6837.

Yun, Wan Soo, "Fabrication of metal nanowire using carbon nanotube as a mask," J. Vac. Sci. Technol., Jul./Aug. 2000, A 18(4), pp. 1329-1332.

Zhang, J., "Fabrication and photoluminescence of ordered GaN nanowire arrays," Journal of Chemical Physics, Oct. 1, 2001, vol. 115, pp. 5714-5717.

Zhang, R. Q., "Silicon nanotubes: Why not?," Chemical Physics Letters, 2002, vol. 364, pp. 251-258.

Zhang, Shengjun et al. "Select Pathways to Caron Nanotube Film Growth." Advanced Materials (Dec. 3, 2001); 13, 1767-1770.

Zhang, Y. et al. " Metal coating on suspended carbon nanotubes and its implication to metal-tube interaction." Chemical Physics Letters (Nov. 24, 2000): 35-41.

Zhang, Y.et al. "Electric-field-directed growth of aligned single-walled carbon nanotubes." Applied Physics Letters (Nov. 5, 2001): 3155-3157.

Zhang, Y.F., "Liquid Phase Synethesis of Carbon Nanotubes," Physica B 323, 2002, pp. 293-295.

Zhao, Y.-P. et al. "Frequency-dependent electrical transport in carbon nanotubes." Physical Review B (2001); 64, 201402(4).

Zheng et al, "Chemical Vapor Deposition Growth of Well-Aligned Carbon Nanotube Patterns on Cubic Mesoporous Silica Films by Soft Lithography", Chemistry of Materials, Jun. 9, 2001, vol. 13, 2240-2242.

Zheng, Bo, Efficient CVD Growth of Single-Walled Carbon Nanotubes on Surfaces Using Carbon, unknown date.

Zheng, M. J., "Fabrication and optical properties of large-scale uniform zinc oxide nanowire arrays by one-step electrochemical deposition technique," Chemical Physics Letters, 2002, vol. 363, pp. 123-128.

Zhou, Chougwu: et al. "Electrical measurements of individual semiconducting single-walled carbon nanotubes of various diameters," Applied Physics Letters (Mar. 20, 2000): 1597-1599.

Zhu, H. W. et al. "Direct Synthesis of Long Single-Walled Carbon Nanotube Strands." Science (May 3, 2002); 296, 884-886.

* cited by examiner

Figure 1
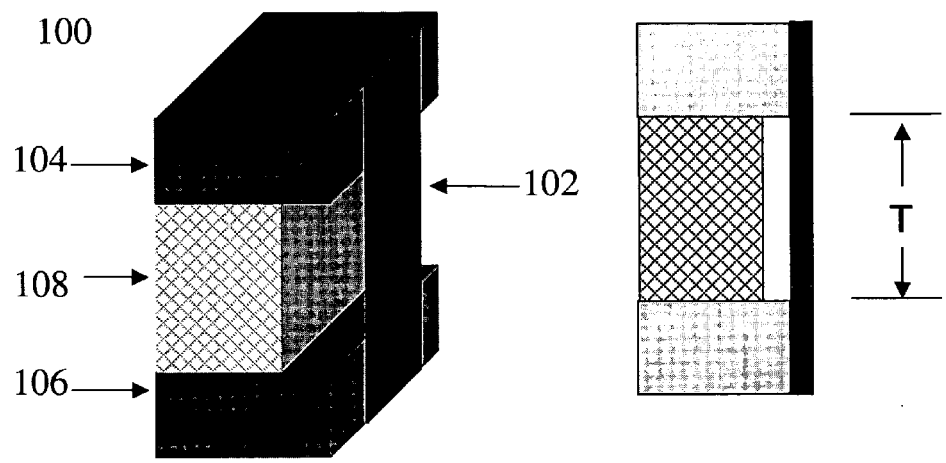
Figure 1A
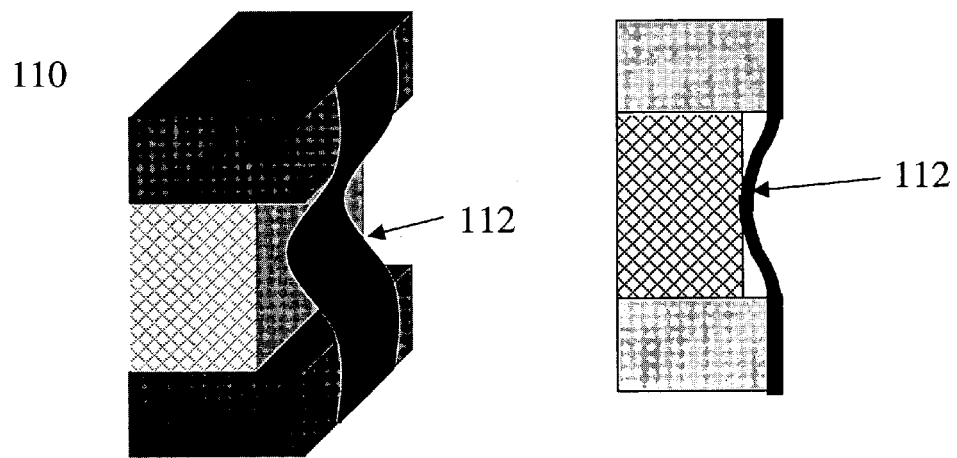
Figure 1B

DEVICES HAVING VERTICALLY-DISPOSED NANOFABRIC ARTICLES AND METHODS OF MAKING THE SAME

CROSS-REFERENCE TO RELATED APPLICATIONS

This application claims priority under 35 U.S.C. §119(e) to U.S. Provisional Pat. Apl., Ser. No. 60/446,786, filed on Feb. 12, 2003, entitled Electro-Mechanical Switches and Memory Cells Using Vertically-Disposed Nanofabric Articles and Methods of Making the Same and to U.S. Pat. Apl. No. 60/446,783, filed on Feb. 12, 2003, entitled Electro-Mechanical Switches and Memory Cells Using Horizontally-Disposed Nanofabric Articles and Methods of Making the Same, which are incorporated herein by reference in their entirety.

This application is a continuation and claims priority under 35 U.S.C. §120 to U.S. patent application Ser. No. 10/776,572, filed on Feb. 11, 2004, now U.S. Pat. No. 6,924,538 entitled Devices Having Vertically-Disposed Nanofabric Articles and Methods of Making the Same.

This application is a continuation-in-part and claims priority under 35 U.S.C. §120 to the following applications which are expressly incorporated herein by reference in their entirety:

U.S. patent application Ser. No. 09/915,093, filed on Jul. 25, 2001, now U.S. Pat. No. 6,919,592 entitled Electromechanical Memory Array Using Nanotube Ribbons and Method for Making Same;

U.S. patent application Ser. No. 10/033,323, filed on Dec. 28, 2001, now U.S. Pat. No. 6,911,682 entitled Electromechanical Three-Trace Junction Devices.

U.S. patent application Ser. No. 10/128,118, filed Apr. 23, 2002, now U.S. Pat. No. 6,706,402 entitled Nanotube Films and Articles; and U.S. patent application Ser. No. 10/341,005, filed on Jan. 13, 2003, entitled Methods of Making Carbon Nanotube Films, Layers, Fabrics, Ribbons, Elements and Articles.

TECHNICAL FIELD

The present application relates to devices having vertically-disposed and other non-horizontally disposed nanofabric articles and to methods of making the same.

BACKGROUND

Memory devices have been proposed which use nanoscopic wires, such as single-walled carbon nanotubes, to form crossbar junctions to serve as memory cells. (See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94-97, 7 Jul., 2000.) Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

The NTWCM proposals rely on directed growth or chemical self-assembly techniques to grow the individual nanotubes needed for the memory cells. These techniques are now believed to be difficult to employ at commercial scales using modern technology. Moreover, they may contain inherent limitations such as the length of the nanotubes that may be grown reliably using these techniques, and it may difficult to control the statistical variance of geometries of nanotube wires so grown. Improved memory cell designs are thus desired.

U.S. Patent Publication No. 2003-0021966 discloses, among other things, electromechanical circuits, such as memory cells, in which circuits include a structure having electrically conductive traces and supports extending from a surface of a substrate. Nanotube ribbons are suspended by the supports that cross the electrically conductive traces. Each ribbon comprises one or more nanotubes. The ribbons are formed from selectively removing material from a layer or matted fabric of nanotubes.

For example, as disclosed in U.S. Patent Application Publication No. 2003-0021966, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state. The deflected, physical state has non-volatile properties, meaning the ribbon retains its physical (and therefore informational) state even if power to the memory cell is removed. As explained in U.S. Patent Application Publication No. 2003-0124325, three-trace architectures may be used for electromechanical memory cells, in which the two of the traces are electrodes to control the deflection of the ribbon.

SUMMARY

The present invention provides new devices having vertically-disposed nanofabric articles and methods of making same.

Under certain aspects of the invention, an electromechanical device, includes a structure having a major horizontal surface and a channel formed therein. A conductive trace is in the channel; and a nanotube article vertically suspended in the channel, in spaced relation to a vertical wall of the channel. The article is electro-mechanically deflectable in a horizontal direction toward the conductive trace.

Under another aspect of the invention, the vertically suspended extent of the nanotube article is defined by a thin film process.

Under another aspect of the invention, the vertically suspended extent of the nanotube article is about 50 nanometers or less.

Under another aspect of the invention, the nanotube article is clamped with a conducting material disposed in porous spaces between some nanotubes of the nanotube article.

Under another aspect of the invention, the nanotube article is formed from a porous nanofabric.

Under another aspect of the invention, the nanotube article is electromechanically deflectable into contact with the conductive trace and the contact is either a volatile state or non-volatile state depending on the device construction.

Under other aspects of the invention, the vertically oriented device is arranged into various forms of three-trace devices.

Under yet other aspects of the invention, the channel may be used for multiple independent devices, or for devices that share a common electrode.

BRIEF DESCRIPTION OF THE DRAWINGS

In the Drawing,

FIGS. 1A-B are perspective and cross-sectional views of an exemplary electromechanical switch;

FIGS. 3A-4C are cross-sectional diagrams of three-trace devices according to certain embodiments of the invention;

DETAILED DESCRIPTION

Figure 2A:
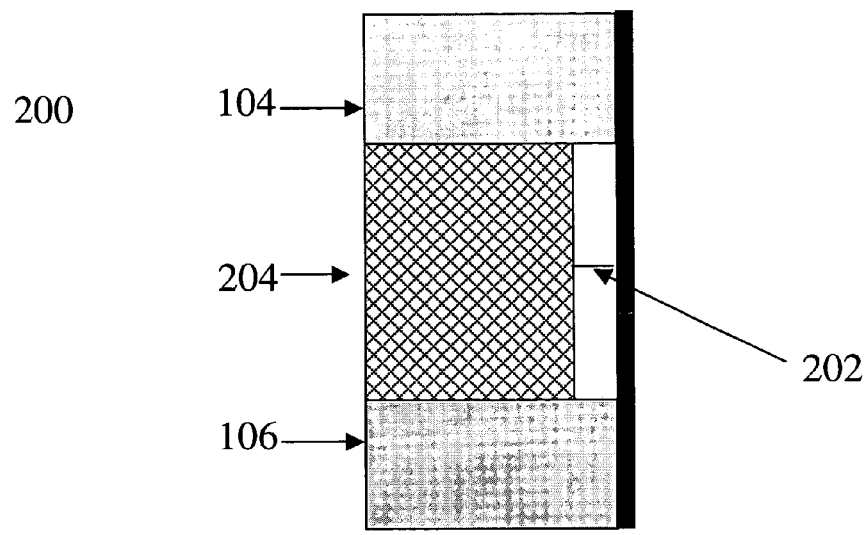
FIGS. 2A-B are cross-sectional views of devices according to certain embodiments of the invention.

Preferred embodiments of the invention provide new articles having non-horizontally-disposed nanotube articles and provide methods of making same. Some embodiments provide improved ways of clamping or pinching suspended nanotube articles to improve their performance and manufacturability. Other embodiments provide electromechanical memory cells, which may be discrete or embedded. Under some embodiments, the discrete memory cells use new approaches to connect to other circuitry or cells, which lowers the resistivity of traces to the memory cells. Still other embodiments provide memory cells that have volatile information state (i.e., the information state is lost when power is interrupted). Some other embodiments use three-trace architectures analogous to those of U.S. Patent Application Publication No. 2003-0124325, in that a nanofabric article may be disposed between the electrodes to cause the article to deflect toward or away from one electrode or the other. These embodiments may utilize a combination of volatile and non-volatile characteristics; for example, information state may be non-volatile, but the device may use a three-trace architecture in which the deflection of the nanotube article may be caused by a trace having volatile state characteristics.

Nanofabrics or ribbons, created by growth or application of individual tubes have been shown to substantially conform to substrate surfaces, such as a surface of a semiconductor substrate. Preferred embodiments of the present make devices such as electromechanical switches and memory cells using nanofabrics that conform to a surface which is substantially perpendicular to a semiconductor substrate (i.e. the nanofabrics are vertically-oriented, relative to a horizontal substrate). Devices and fabrication techniques to develop such vertically-disposed devices are described below, and include the ability to form switches and memory cells having relatively short spans of vertically suspended nanofabric articles with corresponding reductions in gap heights. In some embodiments, this allows for the use of smaller device dimensions and lower electrical resistances (and corresponding decreased cycling times and increased speed, e.g., performance up 100 GHz or more). Volatile and non-volatile switches, and numerous types of devices, examples of which are provided for illustration, can be thus created. In certain preferred embodiments, the articles are substantially a monolayer of carbon nanotubes.

FIGS. 1A-B are perspective and cross-sectional views of an exemplary electromechanical switch. Structure 100 (FIG. 1(A)) depicts an "off" state and structure 110 (FIG. 1(B)) depicts an "on" state. The designations "on" and "off" are in some sense arbitrary, and this notation may be reversed with no loss of generality. In this embodiment, the structure contains nanofabric article 102 spanning between an upper insulating support structure 104 and a lower insulating support structure 106. Disposed between upper and lower insulating support structures 104 and 106 is an electrode 108.

Note that reference to a nanofabric, such as nanofabric article 102, is generally meant to include any suitable structure or article comprising nanotubes, and specifically includes ribbons and nanofabric electrodes containing nanotubes.

Figure 5:
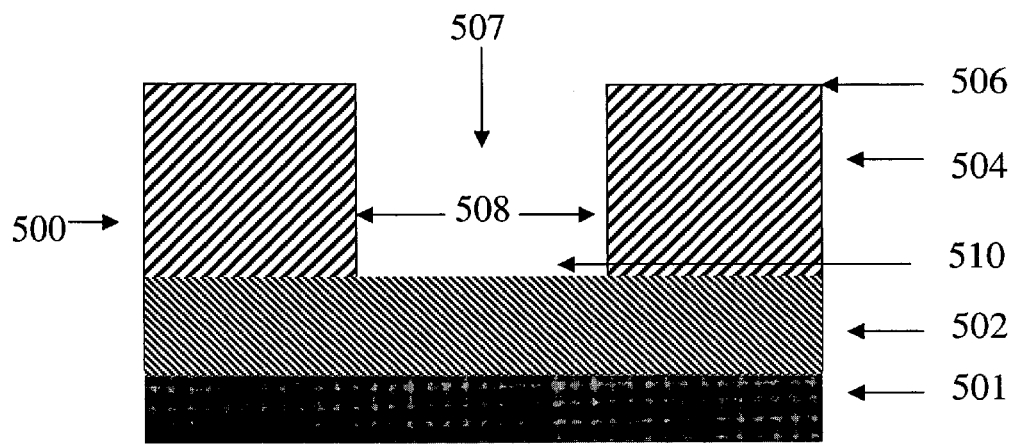
FIGS. 5A-L illustrate an exemplary method of fabricating devices according to certain embodiments of the invention.
Figure 5:
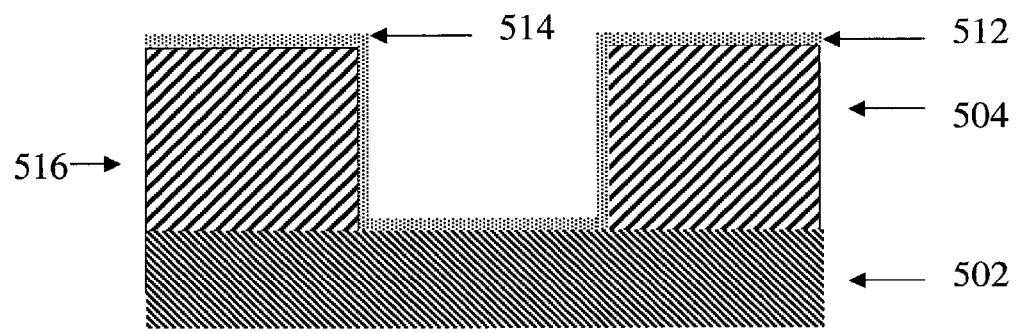

Under certain preferred embodiments, a nanofabric article 102 has a span T of less than about 180 nm or smaller and is pinned to insulating support structures 104 and 106 (seen more clearly in FIG. 5L). The span of nanofabric will depend on deposition technique used, and under certain embodiments suspended spans can be shorter than lithographically-produced spans. The inventors envision vertical spans as small or smaller than 30 nm. Pinning of nanofabric articles is described here and elsewhere in the incorporated references in more detail. The electrode 108 may be made of any suitable electrically conductive material and may be arranged in any of a variety of suitable geometries. Certain preferred embodiments utilize n-doped silicon to form such a conductive element which can be, preferably no wider than the nanofabric article 102, e.g., about 180 nm or below. Other embodiments utilize metal as conductor. In certain embodiments the electrode 108 can be constructed from a nanofabric as well.

The material of the insulating support structures 104 and 106, likewise, may be made of a variety of materials and into various geometries, but certain preferred embodiments utilize insulating material, such as spin-on-glass (SOG) or silicon nitride or silicon oxide.

As will be explained below, in certain embodiments, the nanofabric article 102, as shown is held to the insulating support structures by friction. In other embodiments, the nanofabric article 102 may be held by other means, such as by anchoring, stitching or pinning the nanofabric to the insulating support structures using any of a variety of techniques.

Specifically, the nanofabric article 102 may be coupled to another material by introducing a matrix material into the spaces between nanotubes in a porous nanofabric to form a conducting composite junction, as described in the references incorporated above. Electrical and mechanical advantages may be obtained by using such composite junctions and connections. In one example, a conducting material is deposited onto the nanofabric and is allowed to penetrate into the spaces within the porous nanofabric, thus forming an improved electrical connection to the nanofabric and reduces contact resistance in the article. In another example, an insulating material is deposited onto the nanofabric and is allowed to penetrate into the spaces within the porous nanofabric, thus forming an improved mechanical pinning contact that increases reliability and manufacturability.

Evaporated or spin-coated material such as metals, semiconductors or insulators especially—silicon, titanium, silicon oxide or polyamide—may be used to increase the pinning strength. The friction interaction can be increased through the use of chemical interactions, including covalent bonding through the use of carbon compounds such as pyrenes or other chemically reactive species. See R. J. Chen et al., "Noncovalent Sidewall Functionalization of Single-Walled Carbon Nanotubes for Protein Immobilization," J. Am. Chem. Soc., vol. 123, pp. 3838-39 (2001), and Dai et al., Appl. Phys. Lett., vol. 77, pp. 3015-17 (2000), for exemplary techniques for pinning and coating nanotubes by metals. See also WO 01/03208 for techniques.

In some embodiments in which a nanofabric article 102 is spaced apart from and crosses a corresponding, oppositely-disposed electrode, the intersection defines a memory or logic cell, switch or relay. More than one memory cell can be used in arrays or as individual or small groups of interconnected switches depending upon the application such as embedded memory, a two-chip memory device, relays or actuators. The actual number of such cells is immaterial to understanding the invention, but the technology may support devices having information storage capacities at least on the order of modern nonvolatile circuit devices.

FIGS. 2A-4C are cross-sectional diagrams of individual nanoswitches illustrating various states of the device.

Figure 2B:
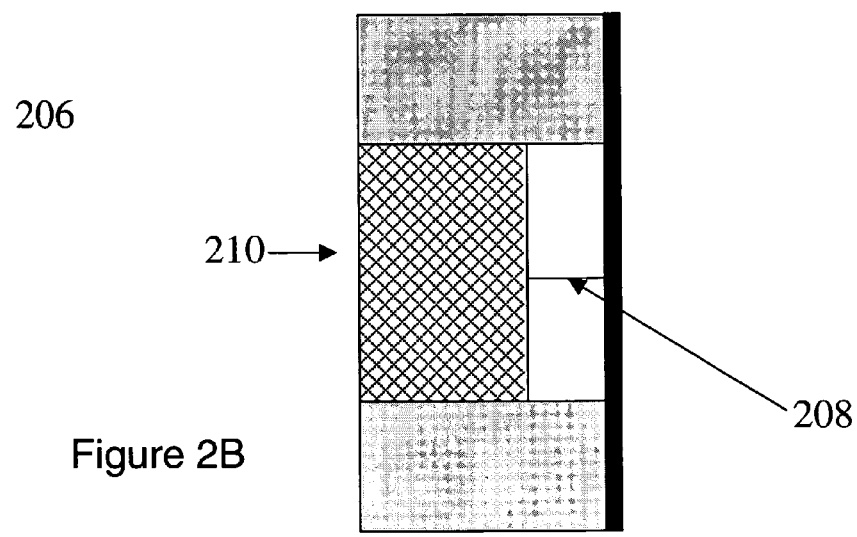

FIG. 2A-B illustrate nanoswitches with different gap distances 202 and 208 between nanofabric article 102 and electrodes 204 and 210, respectively. In preferred embodiments, the vertical spacing between the insulating support structures 104 and 106 is less than 180 nm; this height is dependent upon the deposition technique used. In the case of a switch with a 180 nm span of suspended fabric, the relative separation, i.e. gap distance 202, from the top of insulating support structure 104 to the deflected position where the nanofabric article 102 attaches to electrode 204 should be approximately 5-50 nm. In switches with smaller spans, the gap would likely also be smaller. The magnitude of the gap distance 202 is designed to be compatible with electromechanical switching capabilities of the memory device or other electronic application. The 5-50 nm gap distance is preferred for certain embodiments utilizing nanofabrics 102 made from carbon nanotubes, and reflects the specific interplay between strain energy and adhesion energy for the deflected nanotubes. Other gap distances may be preferable for other materials. Switching between these states is accomplished by the application of specific voltages across the nanofabric article 102 and one or more of its associated electrodes, e.g. 204, 210. Switching forces are based on the interplay of electrostatic attraction and repulsion between the nanofabric article 102 and the electrodes, e.g. 204, 210.

By selecting a gap distance 202 in which the strain energy is lower than the adhesion energy the nanofabric article 102 can remain in permanent "non-volatile" contact with the electrode 204. If a larger gap distance 208 were selected, the strain energy increases to such an extent as to allow the nanofabric article 102 to contact the electrode 210 but not to remain in such contact without additional power input, defining a "volatile" condition. In some embodiments, such a volatile switch is preferred and can be combined with non-volatile switches as is necessary to generate particular electronic devices.

The dimensions given above are exemplary and non-limiting, and can be greater or smaller in some embodiments, depending on the application and materials and techniques used. The length of the nanofabric article 102 in these and other vertically-disposed articles can be quite short in comparison to other types of nanofabric articles. In some cases, thin film techniques, such as thin film deposition or etching can be used rather than using lithographic techniques to form the electrodes and gaps spanned by the suspended nanofabric ribbons. In some embodiments the suspended length can be shorter than the length of the nanofabrics used in horizontally disposed devices, such as those in the incorporated reference entitled "Electro-Mechanical Switches and Memory Cells Using Horizontally-Disposed Nanofabric Articles and Methods of Making the Same" (U.S. Provisional Pat. Apl. Ser. No. 60/446,783), filed on Feb. 12, 2003; filed on even date herewith U.S. Apl. Ser. No yet to be assigned). The dependence on thin film deposition rather than lithographic patterning of the devices makes for more facile manufacturing.

A short span of nanofabric can lead to enhanced reliability and vastly increased switching speeds up to 200 GHz for concomitantly lowered gap heights. Also, shorter spans of nanofabric result in reduced electrical resistance to current flowing through the nanofabric. Further embodiments, below, illustrate other types of vertically-disposed articles, and methods of manufacturing the same.

FIGS. 3A-C illustrate two possible "on" states of certain embodiments of the invention. When the device is as illustrated by 302 (FIG. 3A, structure 300), the nanofabric article 102 is separated from both electrodes 304 and 306 by a distance 202. This state may be electrically detected in any of a variety of ways described in the foregoing references incorporated by reference. In this arrangement, an "off" state corresponds to nanofabric-electrode junction being an open circuit, which may be sensed as such on either the nanofabric article 102 or electrode 304 when addressed. When the cell is as shown by 308 (FIG. 3B, structure 310), the nanofabric article 102 is deflected toward electrode 304. In certain embodiments the "on" states corresponding to the nanofabric-electrode junction is an electrically conducting, rectifying junction (e.g., Schottky or PN), which may be sensed as such on either the nanofabric article 102 or electrode 306 when addressed. When the cell is as shown by 312 (FIG. 3C, structure 314), the nanofabric article 102 is deflected toward electrode 306 generating an "on" state. The figures are not drawn to scale, and the distances 202, for example, need not be equal. Alternatively, one or the other of the electrodes may act as "set" electrode used alone or in combination with the other electrode to cause the nanotube article to deflect into contact with an electrode, and the other of the electrodes may act as a "release" electrode used alone or in combination with the other electrode to cause the nanotube article to release from contact with the electrode.

FIGS. 4A-C illustrate some other possible tristate or tri-trace device configurations. A first tri-trace device 400 (FIG. 4A) has two non-volatile "on" states. The distance 202 between the non-deflected nanofabric article 102 and either electrode 402 or 404 is small enough that upon deflection the nanofabric contacts either electrode 402 or 404. Under this embodiment a stable van der Waals interaction is formed yielding a non-volatile condition in which the deflected nanofabric article 102 contacts either electrode, closing a circuit and remaining in contact with the electrode indefinitely without the need for additional power.

A second tri-trace device 406 (FIG. 4B) allows for nanofabric deflection to be either non-volatile or volatile. If the nanofabric article 102 deflects toward electrode 410, then the distance 202 is small enough to allow for a nonvolatile state as above. If, however the nanofabric article 102 is deflected toward electrode 408, then the gap distance 208, between the nanofabric article 102 and the contacted electrode 408 has been increased such that the strain energy of the stretched nanofabric article 102 overcomes the van der Waals attraction between the nanofabric article 102 and the electrode 408; the nanofabric article 102 briefly forms part of a closed circuit generating a transient "on" state and returns to its non-deflected, open circuit state generating an "off" state.

Compare structure 400, which may be used as non-volatile switch, to structure 406, which includes a volatile switch with gap 208. In structure 406 the gap height 208 between the nanofabric and the electrode 408 has been increased such that the strain energy of the stretched nanofabric overcomes the van der Waals attraction between the fabric and the electrode. The nanofabric forms part of a closed circuit and returns to its non-deflected, open circuit state. It should be noted that the effect of the van der Waals interaction between nanofabrics and other elements can be affected at their interface(s). The effect may be enhanced or diminished; e.g., the attractive force can be diminished by coating the surface of the electrode with a thin layer of oxide or other suitable materials. A purpose of this diminishing of attractive forces may be to create volatile nanoswitches; such volatile switches may be especially useful in applications such as relays, sensors, transistors, etc.

Structure 412 (FIG. 4C) illustrates yet a third tri-trace device where the gap distances 208 between the nanofabric article 102 and the electrodes 414 and 416 are large enough to form volatile nanoswitches as described above.

In certain embodiments involving a non-volatile cell, there is a high ratio between resistances in the "off" and the "on" states. The differences between resistances in the "off" and "on" states provides a means to read which state a junction is in. In one approach, a "readout" current is applied to the nanofabric or electrode and the voltage across the junction is determined with a "sense amplifier" on the electrodes. Reads are non-destructive, meaning that the cell retains its state, and no write-back operations are needed as is required with semiconductor DRAMs. As alluded to above, the three-trace junctions of preferred embodiments bring their own advantages. By allowing for use of tristate memory cells, more information may be stored or represented by a given cell. Moreover, even if only one of the "on" states were used, three-trace junctions may increase switching speeds from the ability to use both conductive traces in concert to apply forces to move an electromechanically responsive nanofabric 102.

Figure 3:
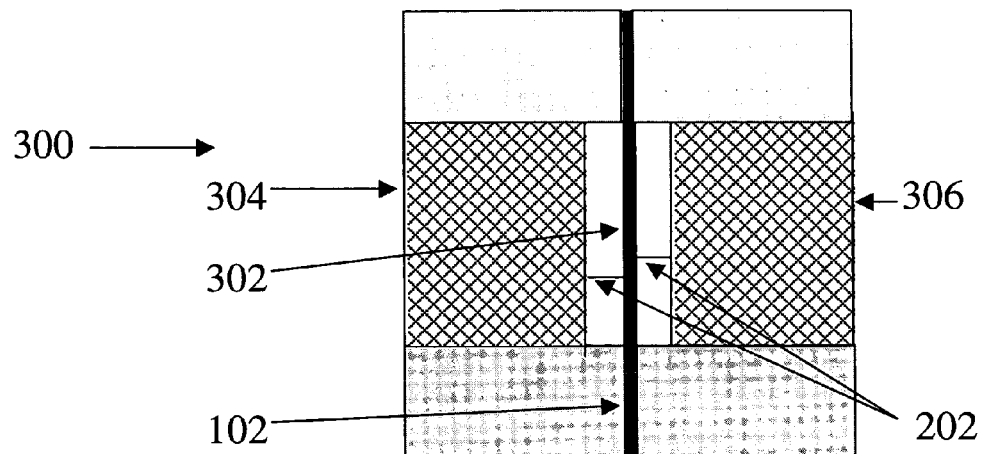
Figure 3:
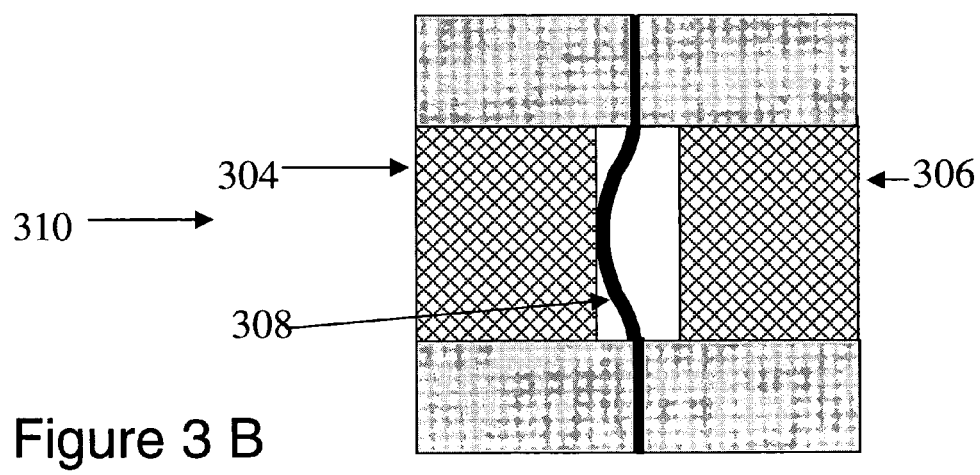
Figure 3:
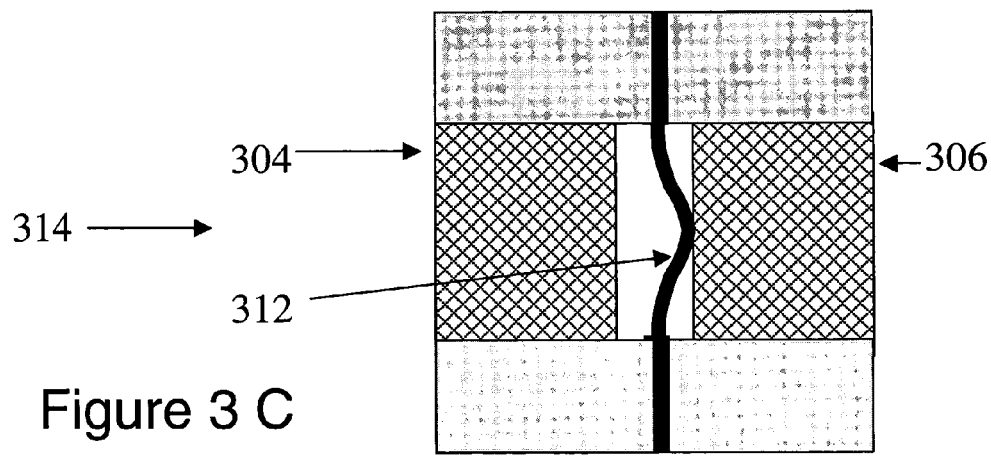
Figure 4:
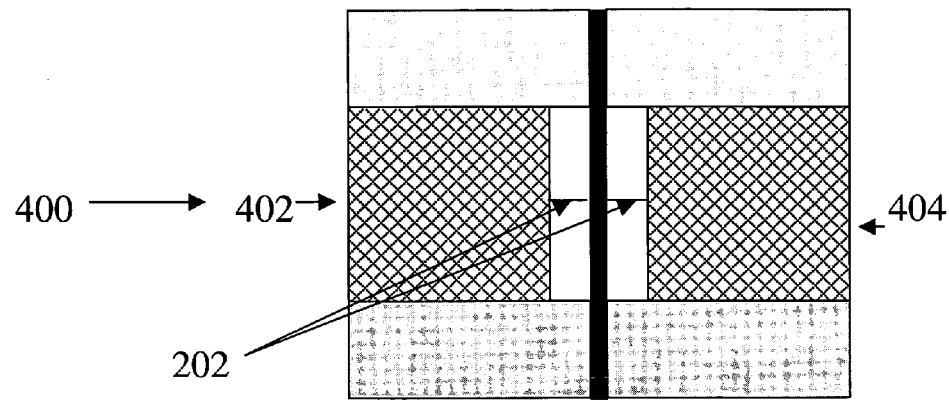
Figure 4:
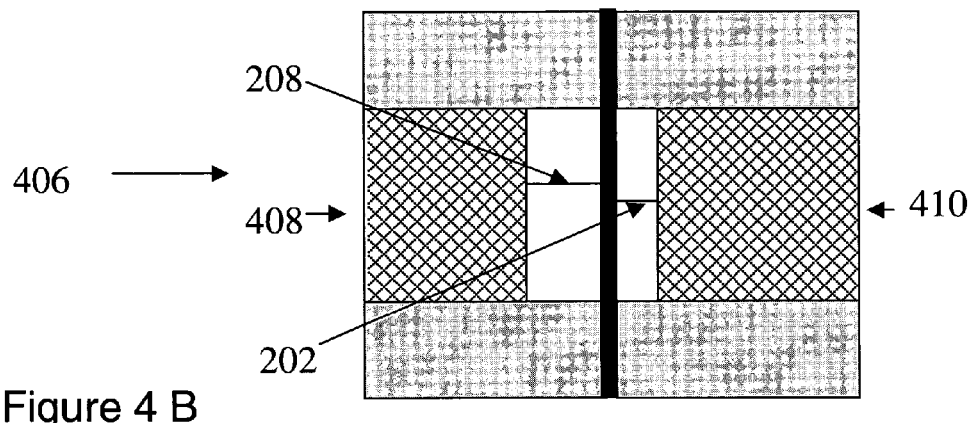
Figure 4:
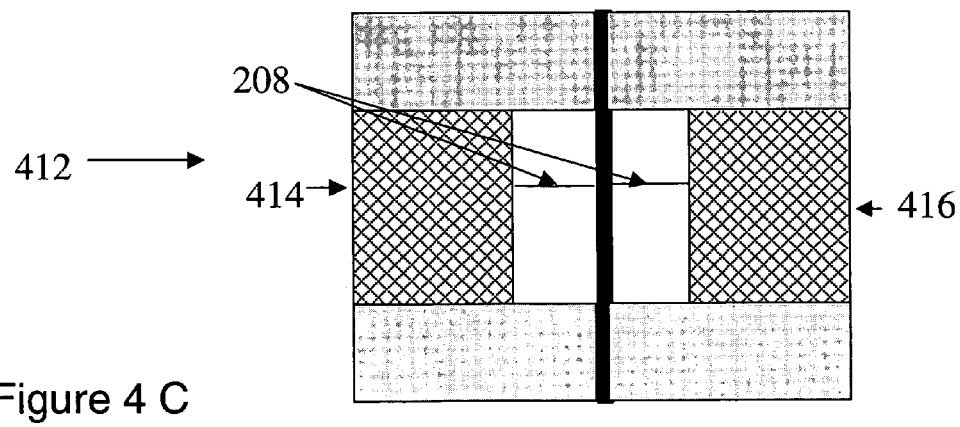

Among other things the structures as shown in FIGS. 3 and 4 (generally) facilitate packaging and distribution, and allow the nanotube-technology cells to be more easily incorporated into other circuits and systems such as hybrid circuits. The vertical nature of the electrical architecture can also facilitate the production of stackable memory layers and the simplification of various interconnects. Preferably, the nanotube patch or segment is clamped (above and below) up to the portion of the nanofabric article that is so suspended. In addition, preferably, the nanofabric article is connected or joined to high conductivity signal paths.

One aspect of the present invention is directed to formation of conductive composite junctions whereby a suitable matrix material is disposed within and around the nanotubes or fibers of a nanofabric or other porous nano material. Such junctions can provide desirable mechanical and/or electrical properties. For example, electrical contact between a nanofabric and a metal connection or activation point may be enhanced, or the contact resistance may be decreased by applying the metal contact as a matrix material impregnating the nanofabric tubes. Also, mechanical contact and strain may be increased as a result of the increased contact between the nanotubes and the matrix material.

Cross-sectional FIGS. 5A-L, collectively, illustrate an exemplary method of fabricating a substantially vertical nano-electromechanical switch. By vertical it is meant that the switching element is substantially perpendicular to the major surface of the substrate. This aspect will be illustrated and described in detail below. Certain advantages can be realized in manufacturing such device using conformal nanotube and/or nanofabric materials. As a result, the length of the nanofabric article can be reduced in some embodiments by about two orders of magnitude. Additionally, the electrical resistance of a current-carrying nanofabric article is substantially reduced when the length of the article is reduced, as described herein.

In FIG. 5A, a semiconductor substrate 501 coated with an insulating layer 502 such as silicon dioxide or silicon nitride is provided. The insulating layer 502 is preferably a few nanometers in thickness but could be as much 1 μm thick depending upon the electrical characteristics desired for different applications. A second layer 504 is deposited on insulating layer 502. Two non-exclusive examples of the material the second layer 504 can be made from are metals and semiconductors; the second layer having a top surface 506. A cavity 507 is defined in the second layer 504. The cavity 507 can be created by reactive ion etching into the second layer 504; the cavity 507 is defined by inner walls 508 and an exposed top surface 510 of insulating layer 502. In certain embodiments, a portion of second layer 504 remains such that the bottom of the cavity 507 is conductive. Alternatively, an insulating layer 502 could be provided to top surface 506 which could be etched to generate a cavity. The cavity 507 can be prefabricated as part of a trench or a via provided as part of preprocessing steps, e.g., as part of an overall integration scheme in generation of an electronic device.

FIG. 5B illustrates a first insulating layer 512 made of silicon nitride or other material deposited on top of the exposed top surface 510 and top surface 506 to generate top layer 514 of intermediate structure 516. According to one embodiment, the first insulating layer 512 is selectively etchable over polysilicon, nanotubes and silicon oxide or other selected insulator. A first insulating layer 512 which will act as a sacrificial layer to create a gap between subsequent layers can be in a range of thicknesses described below as shown in intermediate structure 516.

Figure 5C:
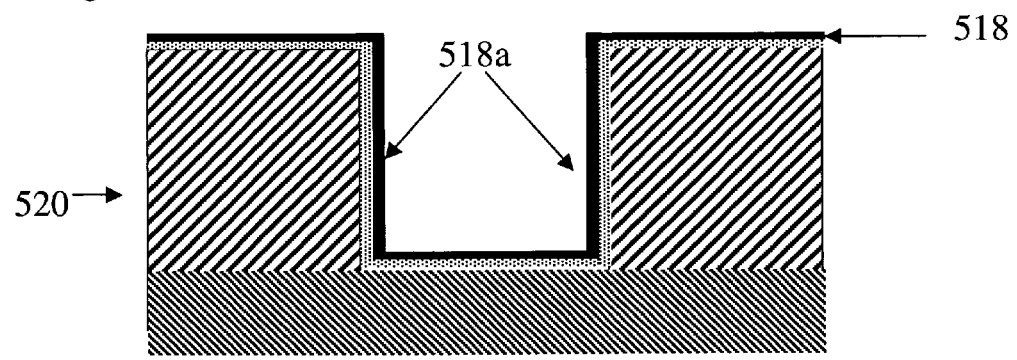
Figure 5:
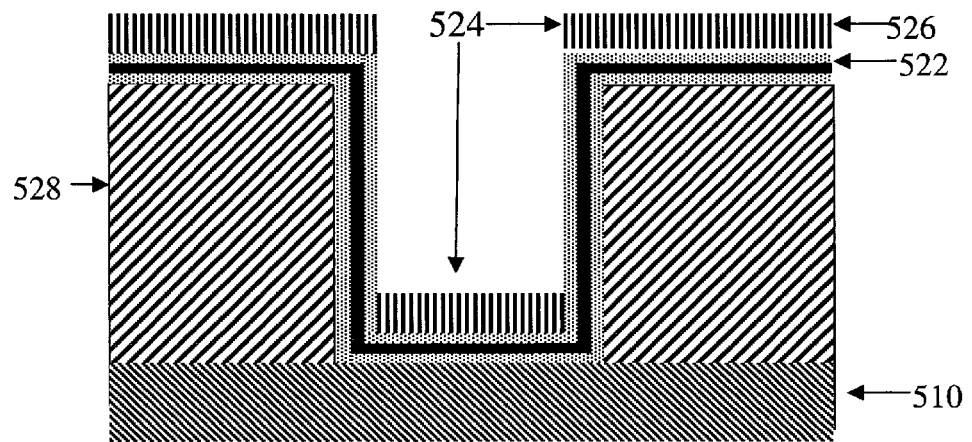
Figure 5:
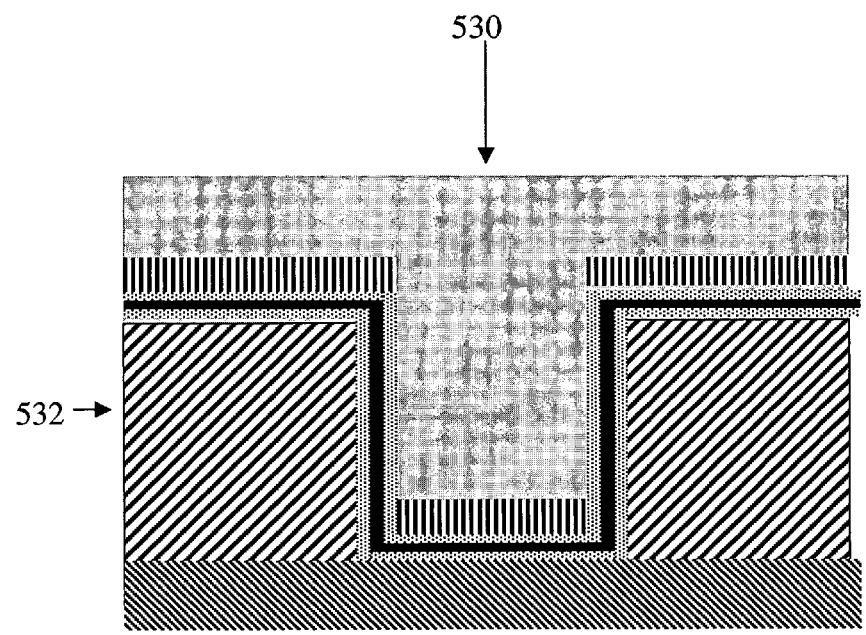
Figure 5:
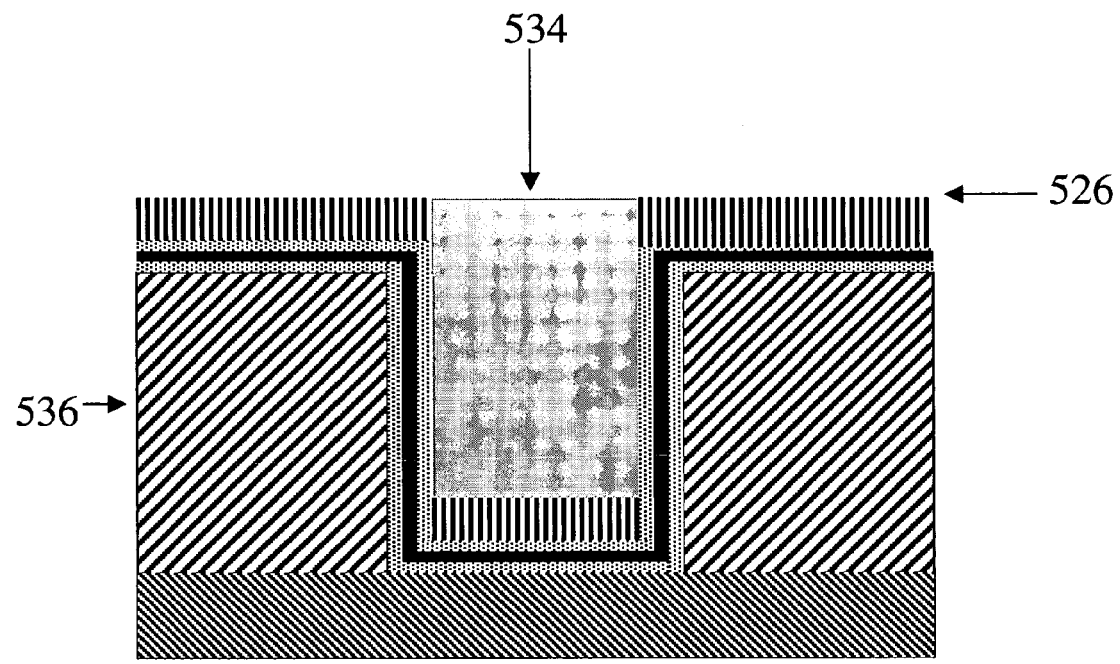
Figure 5:
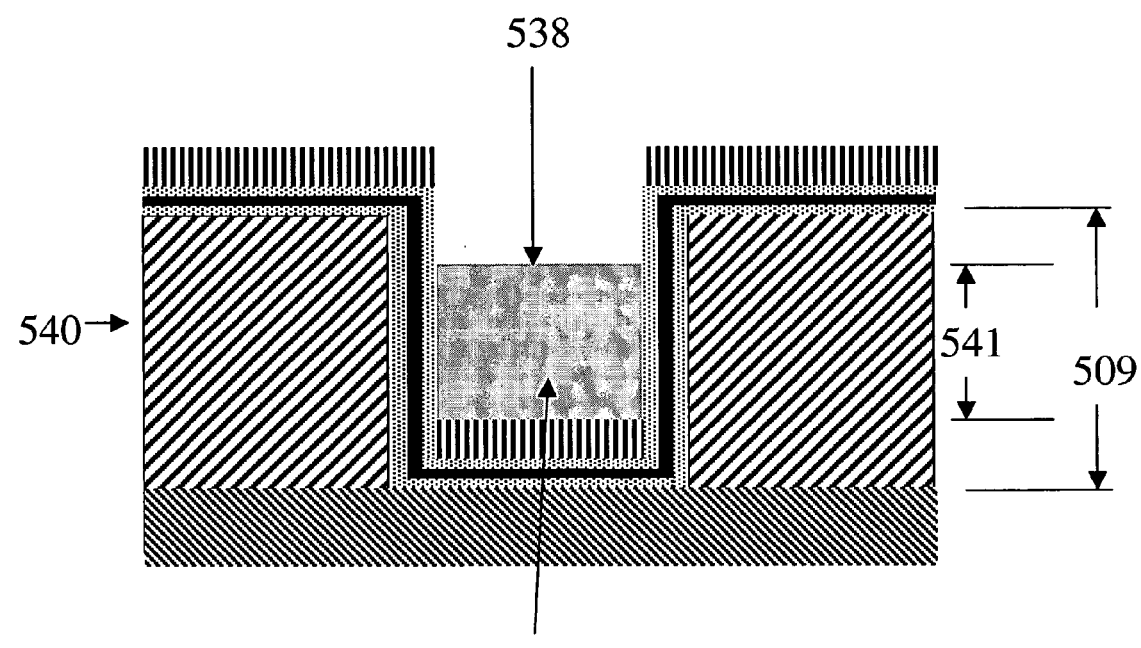
Figure 5:
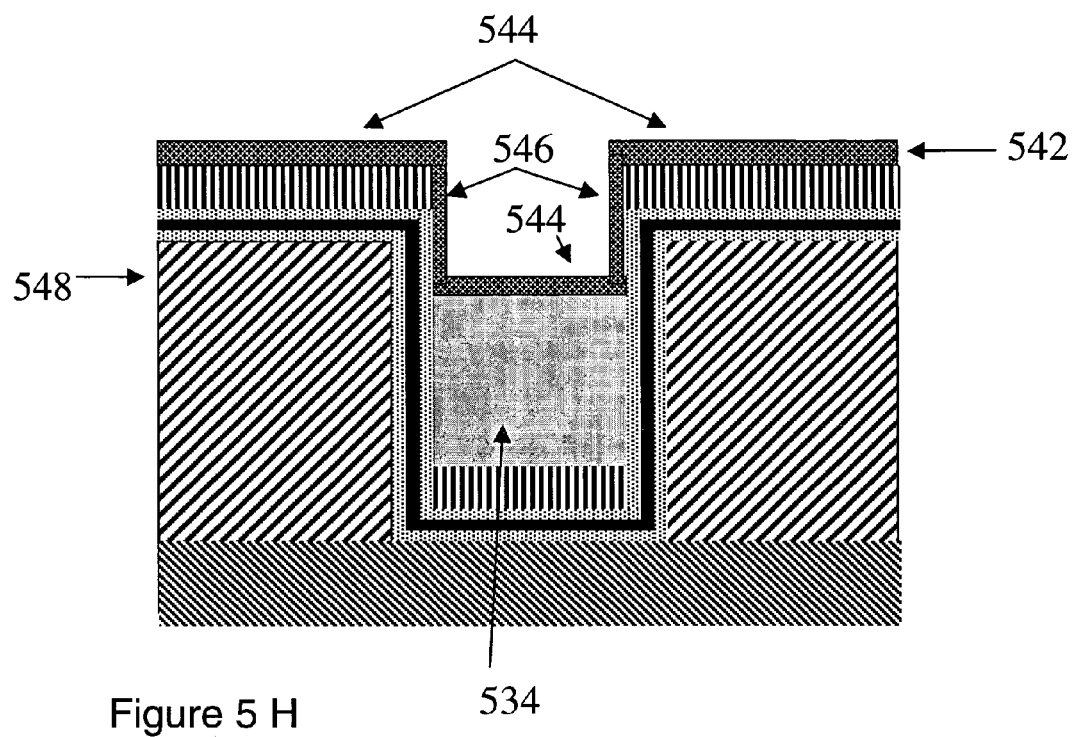
Figure 5:
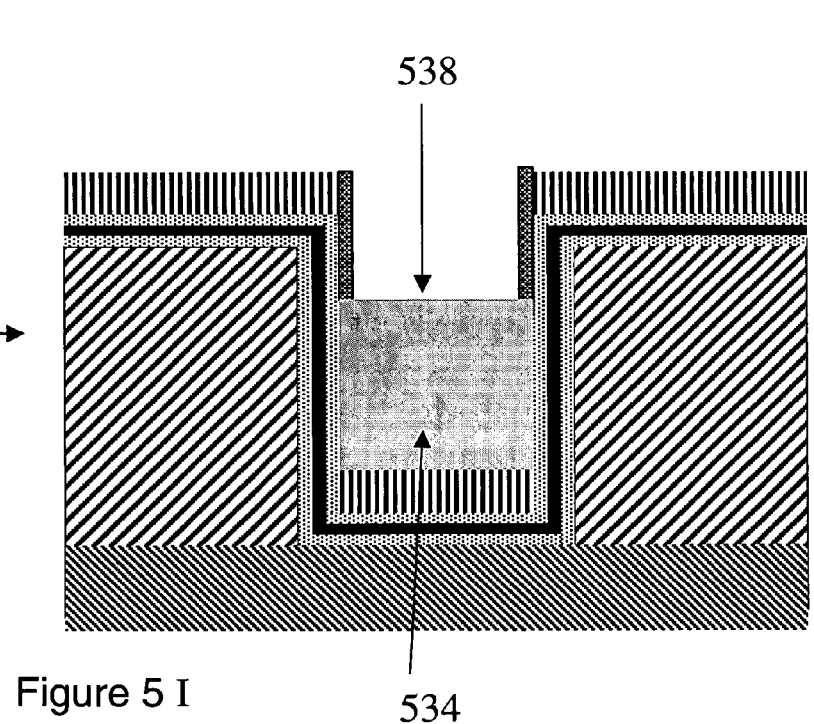
Figure 5:
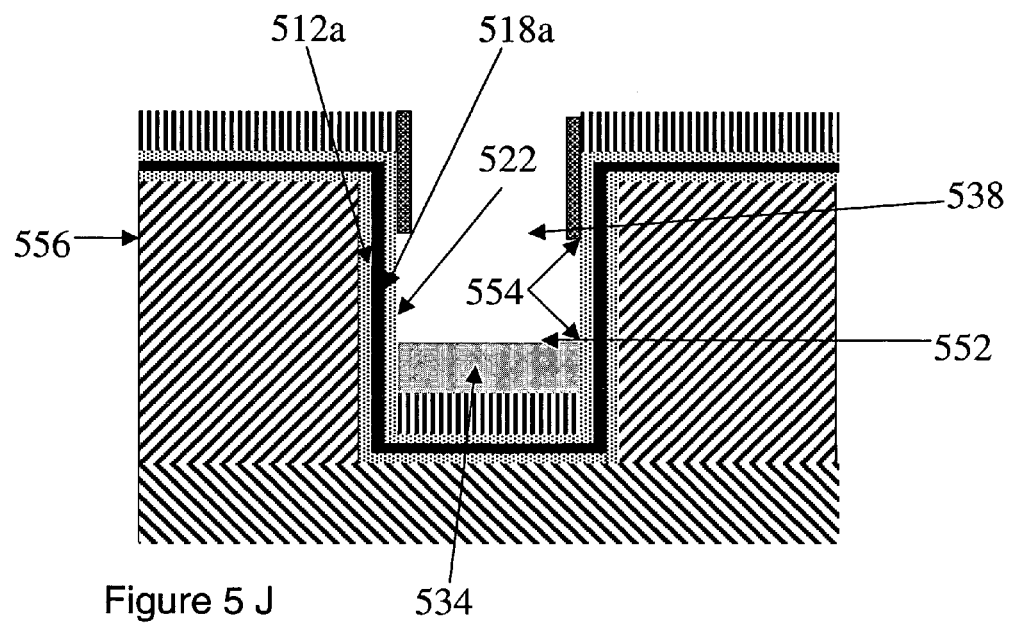
Figure 5:
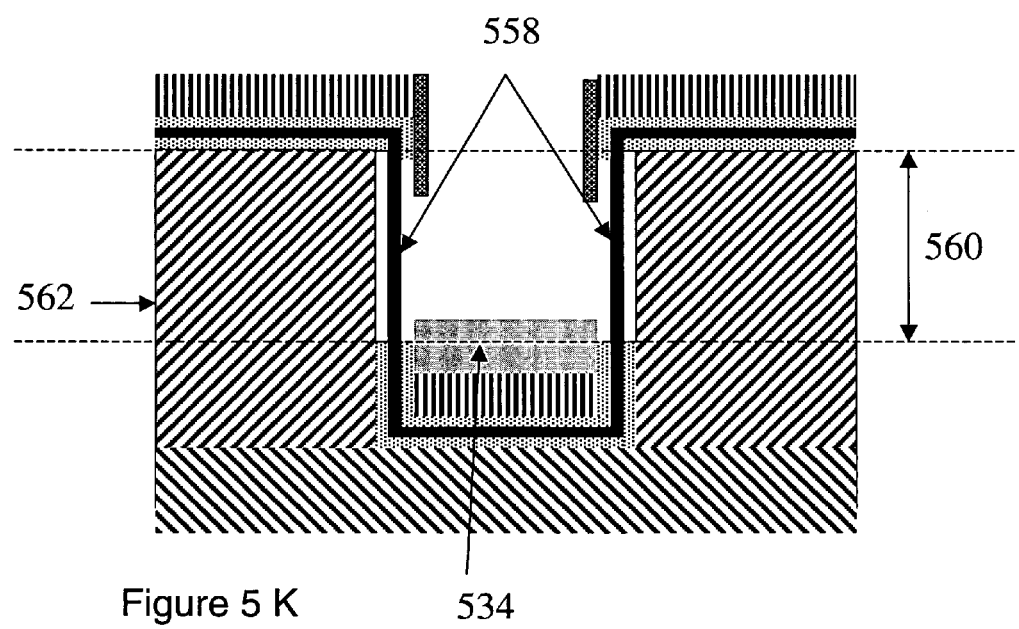
Figure 5:
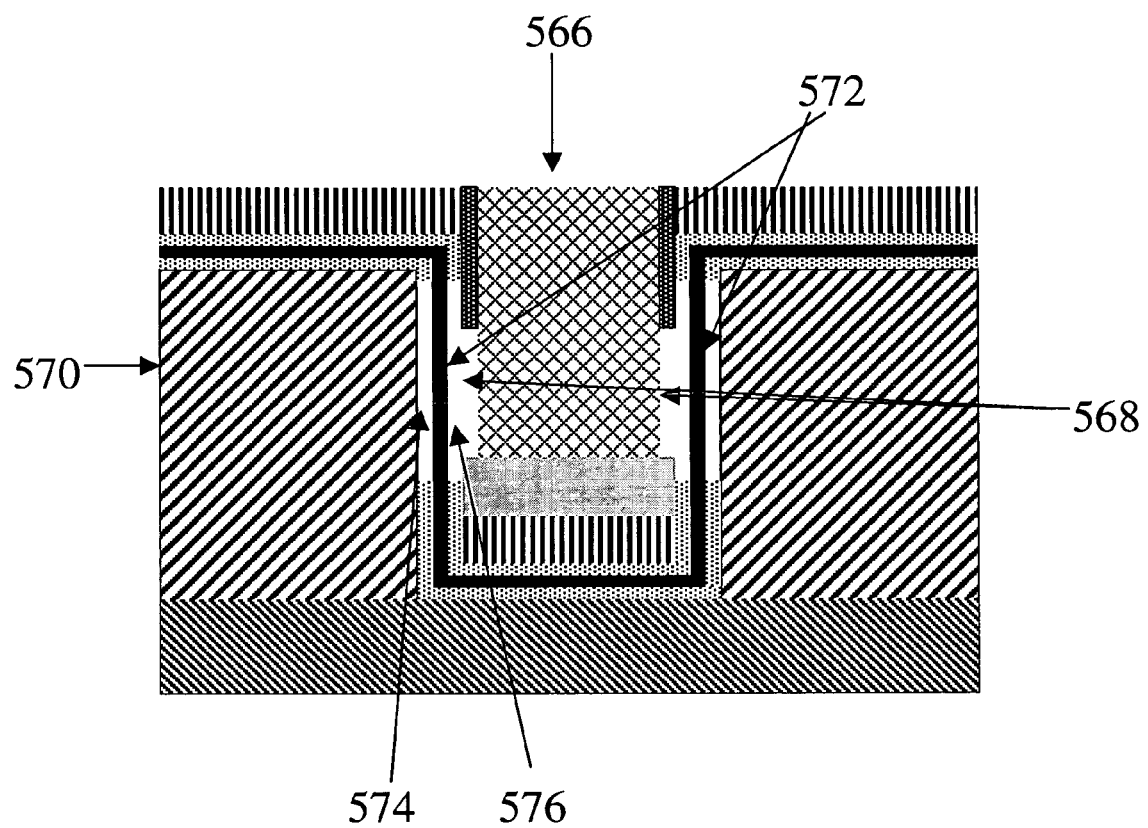

FIG. 5C illustrates a monolayer of nanofabric 518 applied to intermediate structure 516, forming intermediate structure 520. The nanofabric 518 may be applied by chemical vapor deposition, spin coating of suspensions of nanotubes, aerosolized nanotube suspensions or dipping into a solution of suspended nanotubes.

Nanofabric layer 518 conforms to the underlying insulating layer 512 and substantially follows the geometry of cavity 507. Examples of nanofabric articles and methods of manufacturing and using the same can be found in the previously-mentioned and incorporated references. The resulting structure 520 thus includes two vertical portions 518A of the nanofabric 518 which is perpendicular to the major surface of the substrate 501. Devices created using these vertical portions substantially parallel to channel 507 side walls 508, e.g. nano-switches, are termed "vertical" devices or switches.

FIG. 5D illustrates a second insulating layer 522 applied over nanofabric 518. Protective insulating layer 524 is deposited on top of second insulating layer 522 having top surface 526, forming intermediate structure 528. The protective insulating layer 524 is not deposited on the side walls of the channel. The thickness of protective insulating layer 524 can be, for example, on the order of 100 nm, and a non-exclusive example of the method of application of protective insulating layer 524, which may be an oxide layer, is by sputtering or high density plasma deposition of silicon dioxide. The optimal thickness is determined by the particular application to protect the layers below the insulating layer 524 from additional etching or deposition steps.

FIG. 5E illustrates a polysilicon layer 530 deposited on top surface 526 of intermediate structure 528, filling the space between walls 508 in cavity 507. Polysilicon layer 530 can be deposited to a height greater than that of top surface 526 in order to get the proper amount of polysilicon layer into cavity 507, creating an overfilling condition as in intermediate structure 532. Polysilicon layer 530 is subsequently planarized to etched polysilicon 534 with top surface 526 of oxide layer 524 as is illustrated by intermediate structure 536 (FIG. 5F).

FIG. 5G illustrates polysilicon layer 534 etched to a first depth 538, by any appropriate method. An exemplary method of creating such a depth is by reactive ion etch (RIE) as shown in intermediate structure 540; first depth 538 later helps define one edge of a suspended nanofabric segment. The thickness 541 of etched polysilicon layer 534 is dependent on original trench depth 509; for example the depth may be in a range from 200 nm to 1 micron and for applications requiring ultrahigh speed electromechanical switches, the depth would preferably be below 200 nm. This depth can be reduced using thin film manufacturing techniques, as mentioned elsewhere in this document and in the documents incorporated by reference.

FIG. 5H illustrates a layer of oxide 542 deposited on exposed surfaces of intermediate structure 540. Horizontal portions 544 of oxide layer cover trench walls and vertical oxide layers 546 cover exposed, top surfaces of polysilicon layer 534. Horizontal oxide layers 544 are removed, e.g., by oxide spacer etching, leaving intermediate structure 550 (FIG. 5I).

FIG. 5J illustrates polysilicon layer 534 etched to a second depth 552. Second depth 552 may be approximately 50 nm deeper than first depth 538. The defined gap 554 allows exposure of regions of second insulating layer 522 as is shown in intermediate structure 556.

Since preferred nanofabrics are permeable or porous, the regions 512A of first insulating layer 512 below the regions of nanotube fabric 518A are removable, e.g. by wet etching. Removal of materials from beneath a porous nanofabric has been described by the present applicants in the patent references incorporated above. Suitable wet etching conditions to remove the layers of first insulating layer 512 and second insulating layer 522 leave a suspended nanofabric 558 having vertical height 560 as observed in intermediate structure 562 (FIG. 5K). The wet etching may leave an overhang owing to the nature of isotropic wet etching conditions. Other techniques such as dry etching may be utilized to provide an anisotropic etching step.

The vertical height 560 is defined by the etching procedure. For a vertical height 560 of 200 nm the thicknesses of first insulating layer 512 and second insulating layer 522 would be approximately 20 nm in order to provide gap distances to create two non-volatile states. Smaller vertical gaps may be preferred in certain embodiments of the invention, e.g. 30 nm gap heights.

Electrode material 566 is deposited into trench 507, leaving gaps 568 between electrode material 566 and suspended nanotube fabric 558 as shown in intermediate structure 570 (FIG. 5L).

The structure 570 illustrates a pair of vertically-suspended nanofabric portions 572 surrounded by vertical gaps 574, 576 on either side of each portion. The structure may serve as a basis for a pair of bi- or tri-state switching devices as is explained below. The behavior of the switching devices is influenced by the strain in the suspended nanofabric portions and the surrounding gap distances, as discussed herein. Also, many configurations, including common electrode (e.g. 566) configurations may be obtained using the structure 570. It is possible to split structure 570 into two discrete sections (left, right) by a vertical divide running vertically through electrode 566 for example, leaving two bi- or tri-state switches that can be independently operated.

In these and other embodiments, the nature of the resulting devices and switches depends on the construction and arrangement of the electrodes and connections, among other factors. Attention is called to the construction of various types of electrodes in the following embodiments, as an indication of the flexibility of the design and concepts underlying these devices and the variety of their potential uses. For example, some devices share common electrodes between more than one nanofabric article (e.g. two nanofabric switch elements being influenced by a same shared electrode). Other devices have separate electrodes that control the behavior of the nanofabric. One or more electrodes can be used with each nanofabric article to control the article, as mentioned in the incorporated reference entitled "Electromechanical Three-Trace Junction Devices" (U.S. patent application Ser. No. 10/033,323), filed on Dec. 28, 2001.

If vertical height 560 is 200 nm and first insulating layer 512 and second insulating layer 522 are increased to a thickness of about 50 nm the nanotube switch of certain device types would become volatile at the necessary bias voltages because the deflected nanofabric has a strain energy higher than that of the van der Waals force keeping the fabric in contact with metallic region 504 or electrode 566. The thicknesses of first insulating layer 512 and second insulating layer 522 can be adjusted to generate either a non-volatile or volatile condition for a given vertical gap 560 as called for by particular applications with desired electrical characteristics.

Figure 6:
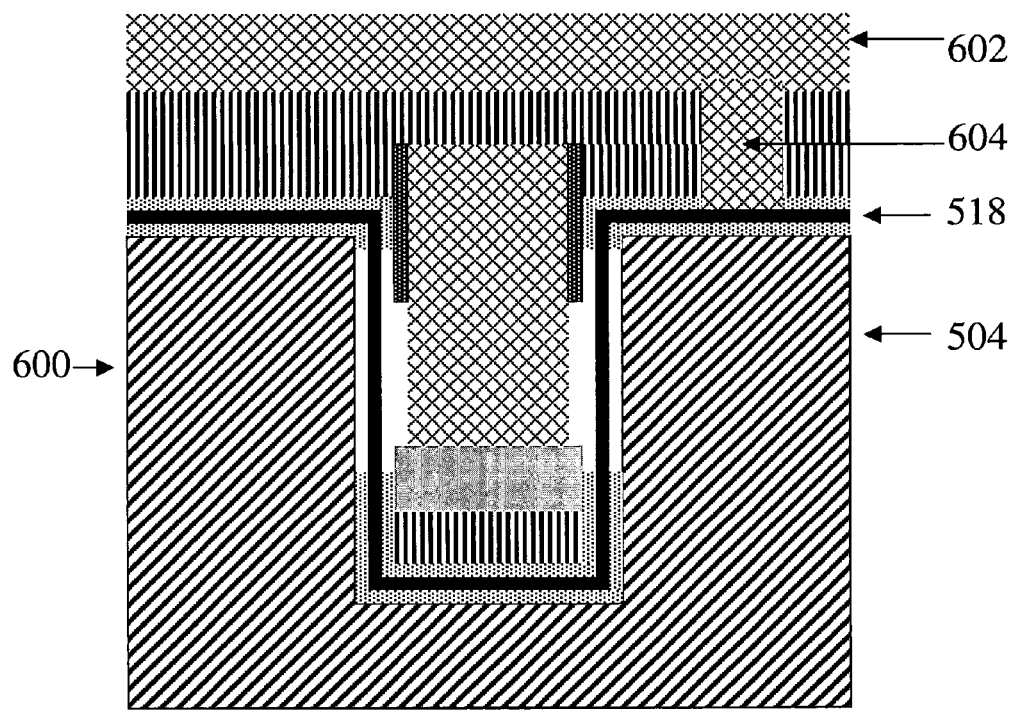
FIG. 6-10 are cross-sectional views of various alternative embodiments of the invention.

Cross-sectional FIG. 6 illustrates an exemplary structure with subsequent layers of metallization. This structure includes electrode interconnect 602 and via 604 in contact with nanofabric 518, and a contiguous metallic layer 504 surrounding the electromechanical switch both laterally and subjacently, as shown in intermediate structure 600.

Figure 7:
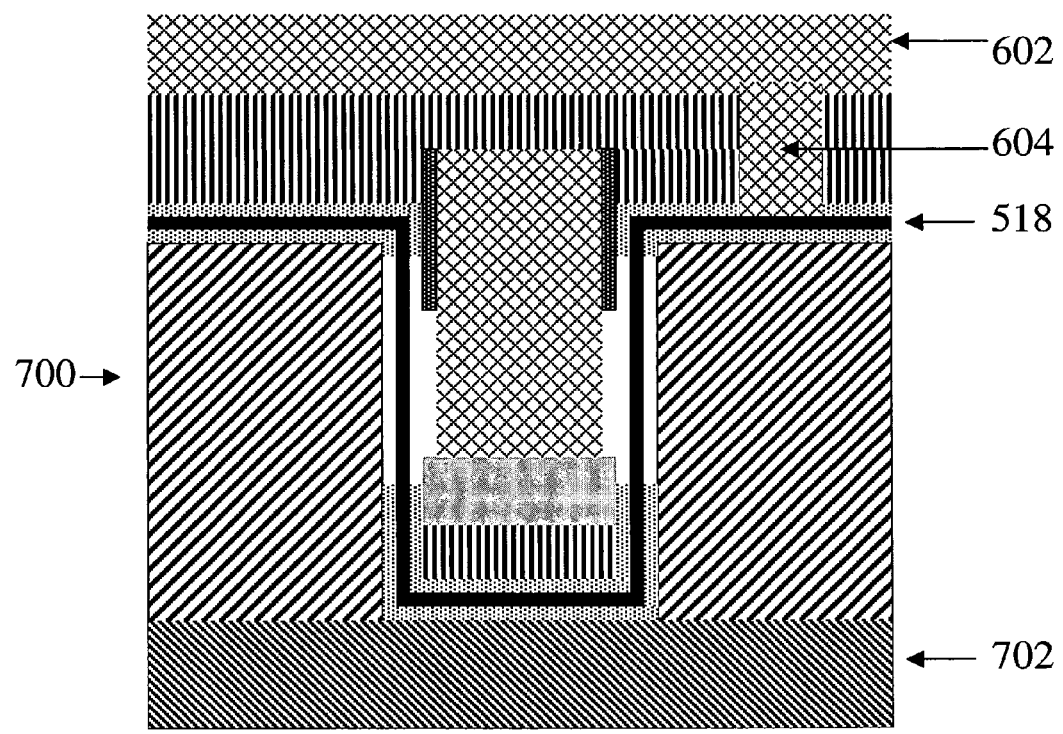

Cross-sectional FIG. 7 illustrates an exemplary structure with subsequent layers of metallization. This structure is similar to intermediate structure 600 in several respects. However, an insulating layer 702 separates the portions of metallic layers 504, and therefore metallic layer 504 does not surround the electromechanical switch elements, preventing crosstalk as shown in intermediate structure 600

Figure 8:
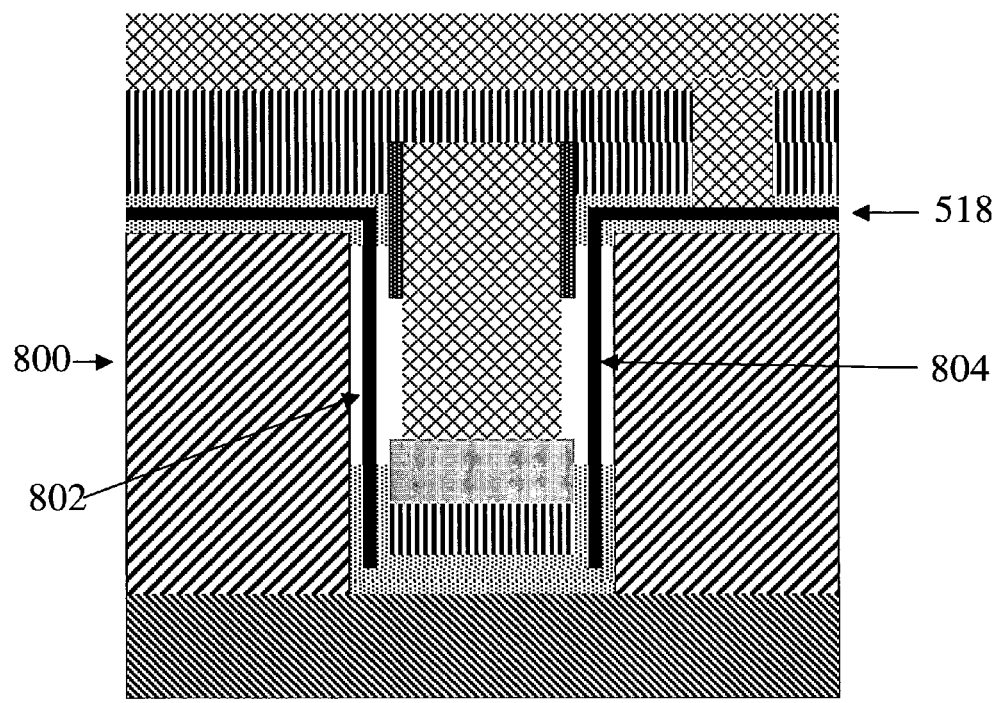

Cross-sectional FIG. 8 illustrates an exemplary structure with subsequent layers of metallization. This structure is similar to intermediate structure 700. However, the nanofabric layer 518 is not continuous, being split at the bottom and therefore there are two independent switches 802, 804, which have no crosstalk, as shown in intermediate structure 800.

Figure 9:
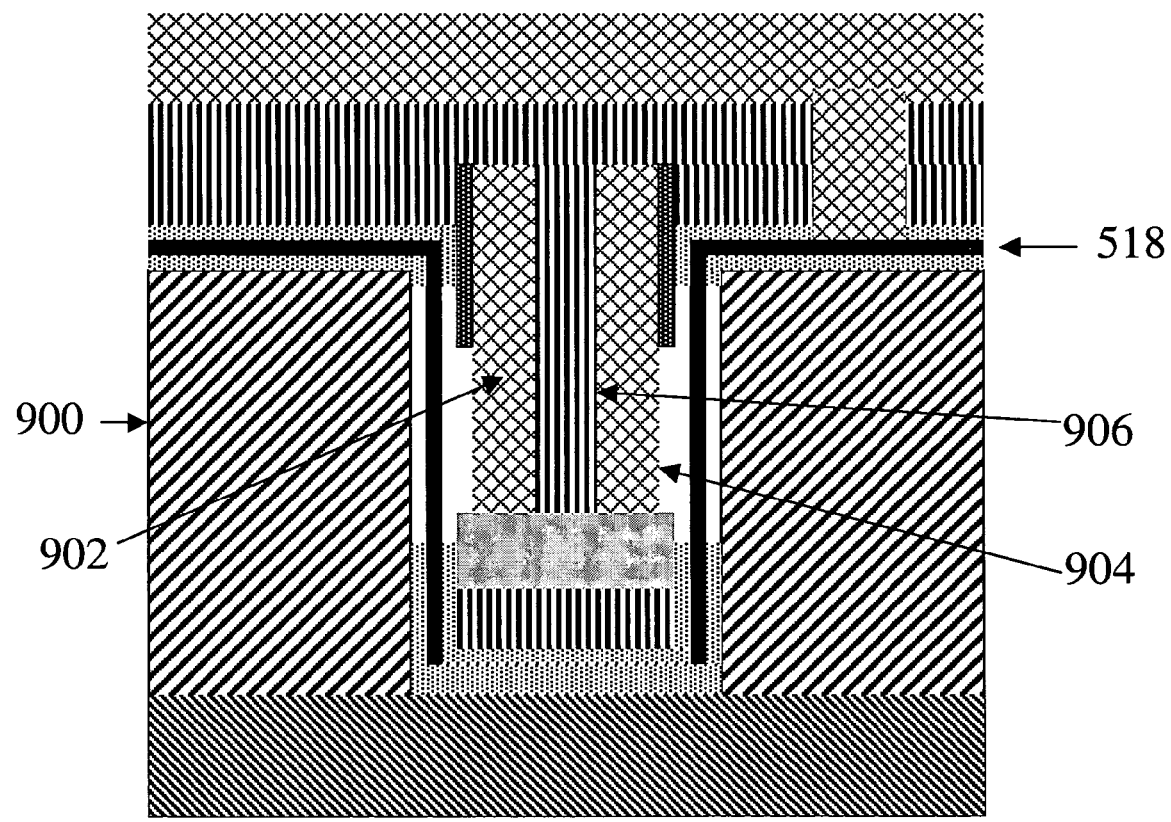

Cross-sectional FIG. 9 is an exemplary structure with subsequent layers of metallization. This structure is similar to intermediate structure 800; however, instead of a single central electrode, there are two central electrodes, 902, 904 separated by insulating layer 906. Thus, intermediate structure 900 has two nano-electromechanical switches, which can be operated independently.

Figure 10:
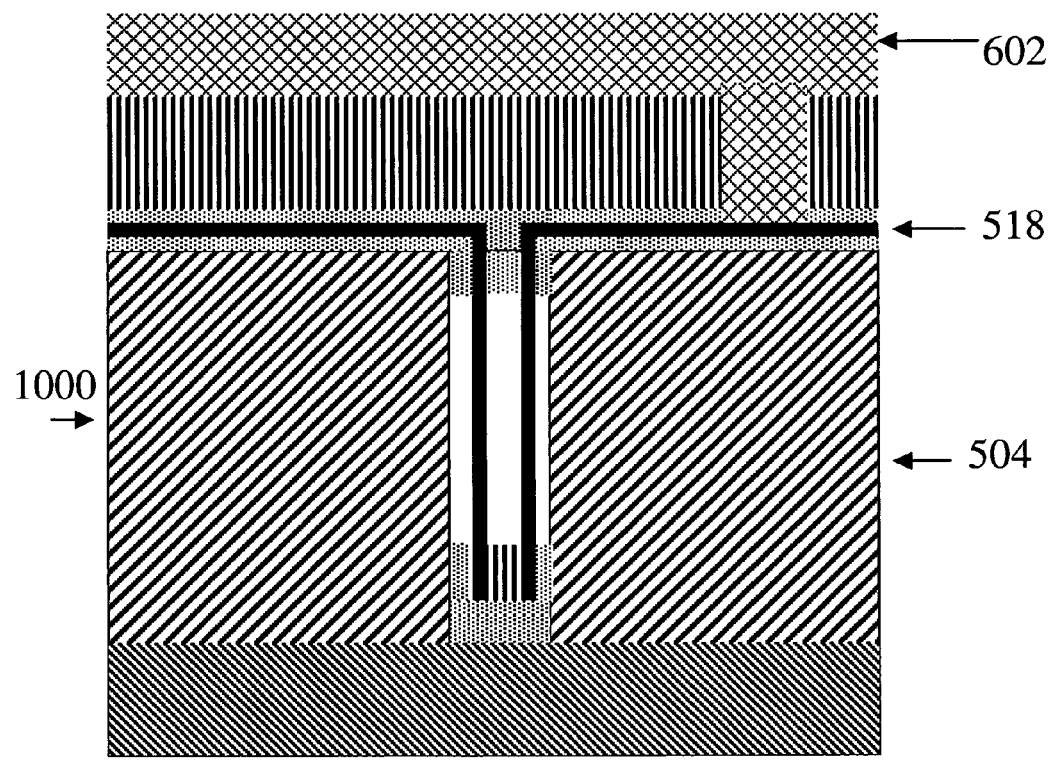

Cross-sectional FIG. 10 is an exemplary structure with subsequent layers of metallization. This structure is similar to intermediate structures 800 and 900, except there is no central electrode, at all. In this embodiment, it is possible for the nanofabric switches to contact metal layers 504 to make a volatile or non-volatile switch, and it is possible for the switches to contact one another so as to be volatile or non-volatile.

The devices and articles shown in the preceding embodiments are given for illustrative purposes only, and other techniques may be used to produce the same or equivalents thereof. Furthermore, the articles shown may be substituted with other types of materials and geometries in yet other embodiments. For example, rather than using metallic electrodes, some embodiments of the present invention may employ nanotubes. In fact, devices comprising nanotube and nanofabric articles in place of the electrodes shown above can be constructed as well.

In certain embodiments it may be advantageous to utilize such nanofabric electrodes as contacts to portions of a transistor or as part of a transistor or to contact or become part of an interconnect for subsequent sense amplifier or addressing logic circuitry, see e.g. U.S. patent application Ser. No. 10/379,973 entitled, Hybrid Circuit Having Nanotube Electromechanical Memory.

Additional electrodes can provide extra control of a switch or device constructed according to the present description. For example, FIG. 6 includes two distinct electrodes that will push and/or pull the vertical nanofabric sections in unison. The gap distances will determine whether the devices are volatile or nonvolatile for a given set of parameters.

FIG. 7 includes 3 distinct electrodes and gives extra degrees of freedom (extra redundancy, extra information storage capability, etc.) to the devices. FIG. 8 also includes 3 electrodes.

FIG. 9 includes 4 distinct electrodes, since the center electrode is divided into two electrodes (902, 904) by application of divider 906.

FIG. 10 includes two electrodes on the sides of the channel, and uses a nanofabric section coupled to top electrode 602 as a third electrode in structure 1000.

As mentioned previously, using vertically-disposed nanofabric articles permits exploitation of the smaller dimensions achievable with thin film technology than with the lithographic techniques used in horizontally-disposed nanofabric articles. For example, returning to FIG. 1A, the dimension T, or thickness of the electrode 108, across which the nanofabric is suspended is as little as a few nm thick (e.g. 10-100 nm), and is formed using thin film techniques. As technology develops in this regard, the thickness T can be less than 10 nm thick. Therefore, the scaling of the dimensions tracks with thin film technology rather than scaling with lithographic technology. It should be noted that the gap distances used with reduced length nanofabric articles may also be decreased accordingly.

Figure 11A:
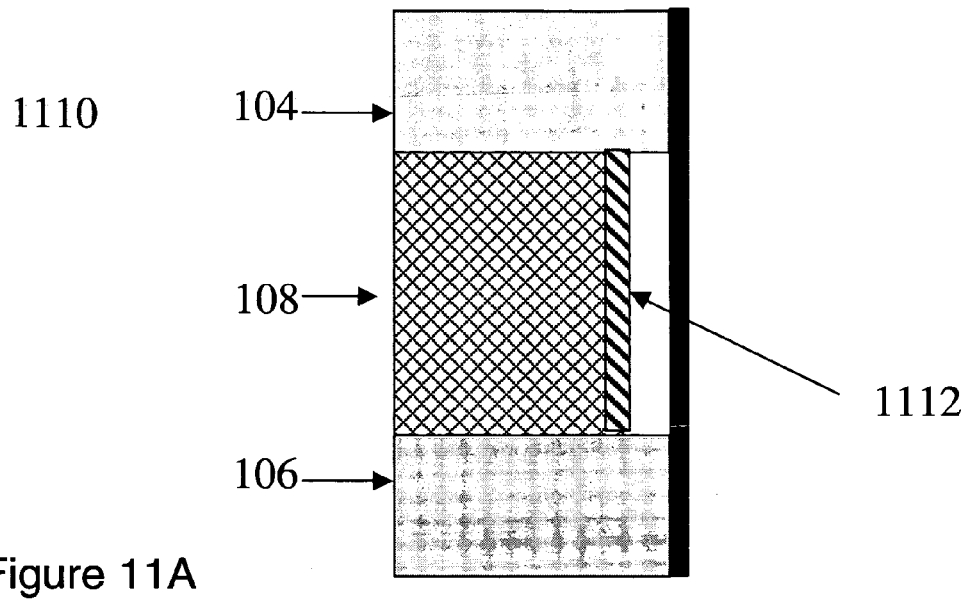
FIGS. 11A-B are cross-sectional views of an exemplary electromechanical devices.
Figure 11B:
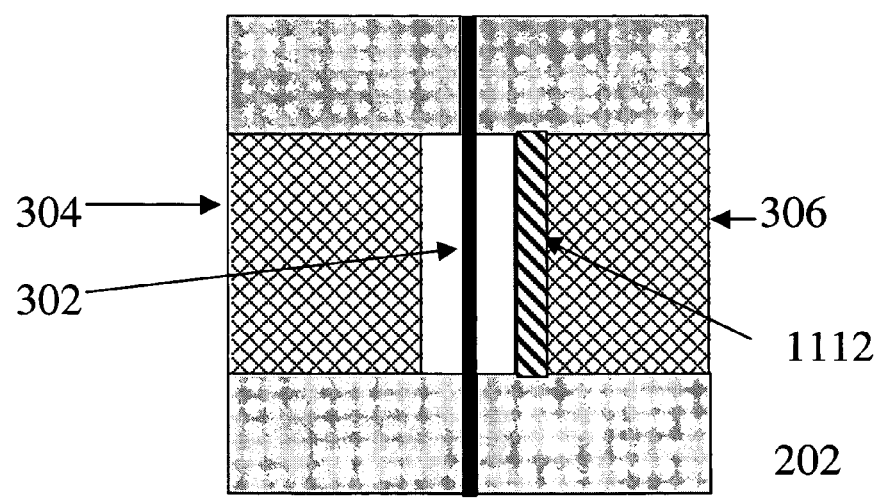

FIGS. 11A-B illustrate an embodiment of the present invention having an oxidized electrode. Structure 1110 illustrates a nanofabric based switch having an insulation layer 1112 over the exposed surface of one electrode 108. (Fabrication of such an oxidized electrode is explained in detail below. The insulation layer 1112 may be used to change the characteristics of the switch to be volatile or to provide further assurance of desired behavior. FIG. 11B illustrates a structure having opposing electrodes with a nanofabric switch disposed between them. The insulating layer, placed on the facing surface of an opposing electrode may be used to prevent different fibers from the nanofabric element from simultaneously electrically contacting both electrodes (304, 306) during a state transition. Such contact may prevent or hinder switching of the fabric between states.

Figure 12:
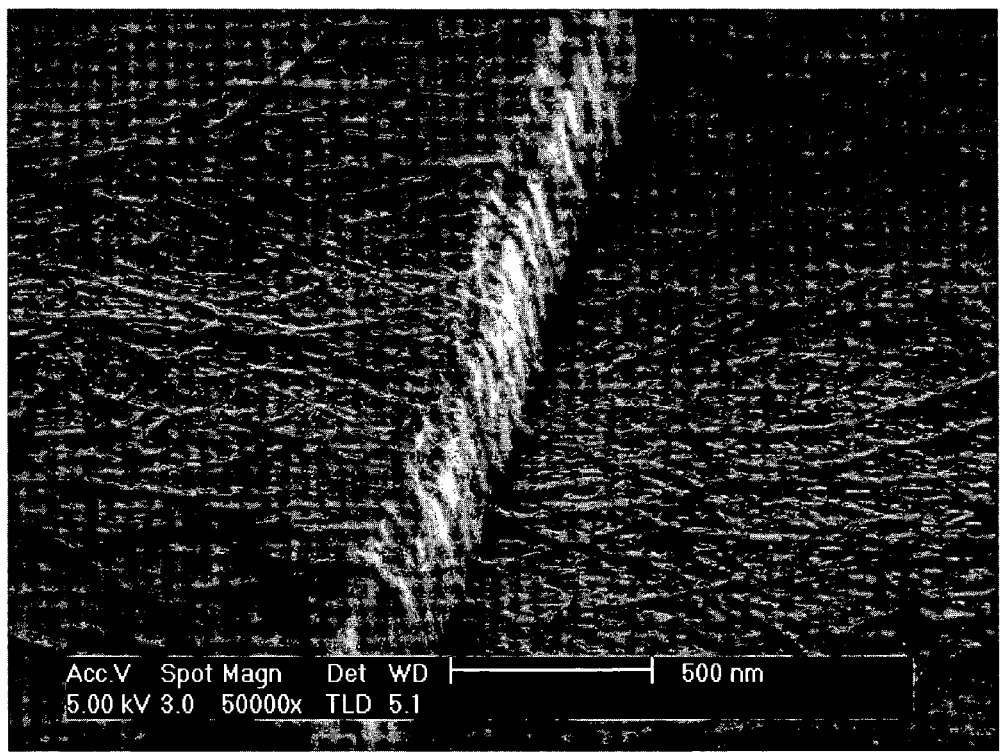
FIGS. 12 and 13 are micrographs of a nanofabric that conforms to non-planar surfaces.
Figure 13:
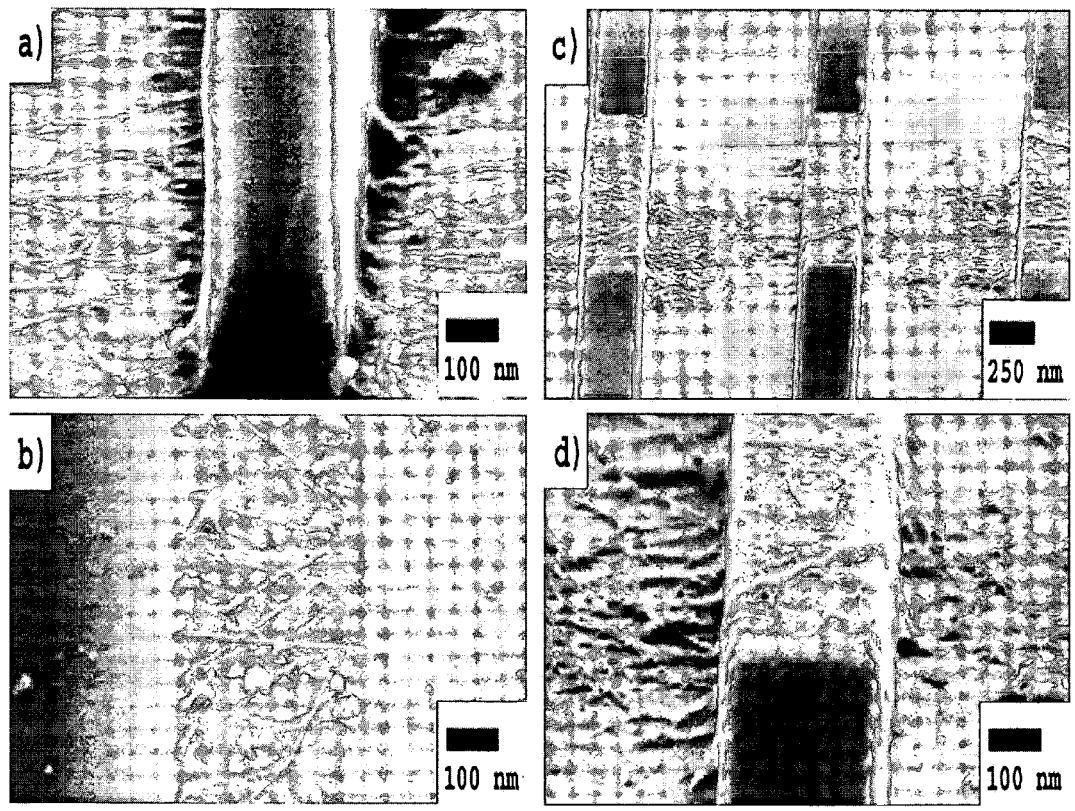

FIGS. 12 and 13 are micrographs of exemplary conformal nanofabrics. These figures illustrate how a fabric looks when formed and made to conform over vertical and horizontal surfaces.

The preferred embodiments are made using nanotube films, layers, or non-woven fabrics so that they form, or may be made to form, various useful patterned components, elements or articles. (Herein "films," "layers," or "non-woven fabrics" are referred to as "fabrics" or "nanofabrics".) The components created from the nanofabrics retain desirable physical properties of the nanotubes and/or the nanofabrics from which they are formed. In addition, preferred embodiments allow modern manufacturing techniques (e.g., those used in semiconductor manufacture) to be employed to utilize the nanofabric articles and devices.

Preferred embodiments of the present invention include articles and methods that increase a strain in the nanofabrics, allowing selectable construction of volatile and non-volatile electromechanical switches, including tri-state or tri-trace switches having both volatile and non-volatile states. The nanofabrics in some embodiments also provide for discrete cellular articles, such as memory cells, to be manufactured.

Figure 14:
FIG. 14 is an image of an exemplary nanofabric shown in perspective.

FIG. 14 is an image of an exemplary fabric of nanotubes shown in perspective. As can be seen, the fabric may be highly porous and appear as several threads with gaps in between. In this figure there are actually several ribbons of nanofabric extending from left to right separated from one another by areas with no nanotubes. One may notice that the fabric of FIG. 13 is likewise very porous with a few nanotubes spanning the channel and contacting electrodes. In both figures, the resolution of the figure is affected by the imaging technology so some nanotubes may not appear in focus or be noticeable.

It will be further appreciated that the scope of the present invention is not limited to the above-described embodiments but rather is defined by the appended claims, and that these claims will encompass modifications and improvements to what has been described.

What is claimed is:

1. An electro-mechanical device, comprising:
   a structure having a major horizontal surface and a channel formed therein, the channel having first and second wall electrodes defining at least a portion of first and second vertical walls of the channel;
   first and second nanotube articles vertically suspended in the channel and in spaced relation to a corresponding first and second wall electrode, and electromechanically deflectable in a horizontal direction toward or away from the corresponding first and second wall electrode in response to electrical stimulation.

2. The electro-mechanical device of claim 1, wherein the first and second nanotube articles are in electrical communication with each other.

3. The electro-mechanical device of claim 2, wherein the first and second nanotube articles comprise two different portions of a nanotube film.

4. The electro-mechanical device of claim 1, wherein the first and second nanotube articles are electromechanically deflectable into contact with the corresponding first and second wall electrode, and wherein at least one contact is a non-volatile state.

5. The electro-mechanical device of claim 1, wherein the first and second nanotube articles are electromechanically deflectable into contact with the corresponding first and second wall electrode, and wherein at least one contact is a volatile state.

6. The electro-mechanical device of claim 1, wherein the first and second wall electrodes are in electrical communication with each other.

7. The electro-mechanical device of claim 1, wherein the first and second wall electrodes are electrically insulated from each other.

8. The electro-mechanical device of claim 1, wherein the first and second nanotube articles are in electrical communication with corresponding high conductivity signal paths.

9. The electro-mechanical device of claim 1, further comprising a first central electrode interposed between the first and second nanotube articles.

10. The electro-mechanical device of claim 9, wherein the first and second nanotube articles are in spaced relation relative to the first central electrode and are electromechanically deflectable in a horizontal direction toward or away from the first central electrode in response to electrical stimulation.

11. The electro-mechanical device of claim 9, wherein the first and second nanotube articles are electromechanically deflectable into contact with the first central electrode in response to electrical stimulation, and wherein at least one contact is a non-volatile state.

12. The electro-mechanical device of claim 9, wherein the first and second nanotube articles are electromechanically deflectable into contact with the first central electrode in response to electrical stimulation, and wherein at least one contact is a volatile state.

13. The electro-mechanical device of claim 9, wherein the first and second nanotube articles are in electrical communication with corresponding high conductivity signal paths, and wherein the first central electrode has independent electrical stimulation.

14. The electro-mechanical device of claim 9, further comprising a second central electrode interposed between the first and second nanotube articles.

15. The electro-mechanical device of claim 14, wherein the first nanotube article is in spaced relation relative to the first central electrode and is electromechanically deflectable in a horizontal direction toward or away from the first central electrode in response to electrical stimulation, and wherein the second nanotube article is in spaced relation relative to the second central electrode and is electromechanically deflectable in a horizontal direction toward or away from the second central electrode in response to electrical stimulation.

16. The electro-mechanical device of claim 15, wherein the first and second nanotube articles are electromechanically deflectable into contact with the corresponding first and second central electrode in response to electrical stimulation, and wherein at least one contact is a non-volatile state.

17. The electro-mechanical device of claim 15, wherein the first and second nanotube articles are electromechanically deflectable into contact with the corresponding first and second central electrode in response to electrical stimulation, and wherein at least one contact is a volatile state.

18. The electromechanical device of claim 15, wherein the first and second central electrodes and the first and second wall electrodes have independent electrical stimulation.

19. An electro-mechanical device, comprising:
a structure having a major horizontal surface and a channel formed therein, the channel having electrodes defining at least a portion of the vertical walls of the channel; and
a nanotube article vertically suspended in the channel, wherein the nanotube article has a length and is in spaced relation to first and second vertical walls of the channel, and is electromechanically deflectable between two positional states, at least one of which is a non-volatile state.

20. The electro-mechanical device of claim 19, wherein the non-volatile state is determined by a geometrical relationship between the nanotube article length and the spaced relation.

21. The electro-mechanical device of claim 19, wherein the non-volatile state is determined by a coating on a wall of the channel.

* * * * *